United States Patent
Taoka et al.

(10) Patent No.: US 8,698,296 B2
(45) Date of Patent: Apr. 15, 2014

(54) SEMICONDUCTOR DEVICE

(75) Inventors: Naoto Taoka, Tokyo (JP); Atsushi Nakamura, Tokyo (JP); Naozumi Morino, Tokyo (JP); Toshikazu Ishikawa, Tokyo (JP); Nobuhiro Kinoshita, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 159 days.

(21) Appl. No.: 12/785,488

(22) Filed: May 24, 2010

(65) Prior Publication Data

US 2010/0301466 A1     Dec. 2, 2010

(30) Foreign Application Priority Data

May 29, 2009    (JP) ................................ 2009-130804

(51) Int. Cl.
     *H01L 23/522*      (2006.01)
     *H01L 23/52*      (2006.01)
     *H01L 23/538*      (2006.01)

(52) U.S. Cl.
USPC .... 257/686; 257/777; 257/779; 257/E23.141; 257/E23.142; 257/E23.169; 257/E25.015

(58) Field of Classification Search
USPC .......... 257/686, 777, 779, E23.141, E23.142, 257/E23.169, E25.015
See application file for complete search history.

(56) References Cited

U.S. PATENT DOCUMENTS 6,150,724 A * 11/2000 Wenzel et al. ................. 257/777
6,157,080 A * 12/2000 Tamaki et al. ................. 257/738
6,677,677 B2    1/2004 Kimura et al.
2002/0041023 A1* 4/2002 Sakamoto et al. ............ 257/706
2006/0076691 A1* 4/2006 Prengel et al. ................ 257/778

FOREIGN PATENT DOCUMENTS

| JP | 07-263449 A | 10/1995 |
| JP | 2002-170848 | 6/2002 |
| JP | 2003-100801 A | 4/2003 |
| JP | 2008-218758 A | 9/2008 |
| JP | 2008-244206 A | 10/2008 |

OTHER PUBLICATIONS

Office Action issued Nov. 27, 2012, in Japanese Patent Application No. 2009-130804.
Japanese Office Action dated Jul. 2, 2013 issued in counterpart Japanese Application No. 2009-130804.

* cited by examiner

*Primary Examiner* — Peniel M Gumedzoe
(74) *Attorney, Agent, or Firm* — Miles & Stockbridge P.C.

(57) ABSTRACT

The reliability of a semiconductor device is to be improved. A microcomputer chip (semiconductor chip) having a plurality of pads formed on a main surface thereof is mounted over an upper surface of a wiring substrate in an opposed state of the chip main surface to the substrate upper surface. Pads coupled to a plurality of terminals (bonding leads) formed over the substrate upper surface comprise a plurality of first pads in which a unique electric current different from the electric current flowing through other pads flows and a plurality of second pads in which an electric current common to the pads flows or does not flow. Another first pad of the first pads or one of the second pads are arranged next to the first pad. The first pads are electrically coupled to a plurality of bonding leads respectively via a plurality of bumps (first conductive members), while the second pads are bonded to the terminals via a plurality of bumps (second conductive members).

1 Claim, 31 Drawing Sheets

SEMICONDUCTOR DEVICE

CROSS-REFERENCE TO RELATED APPLICATIONS

The disclosure of Japanese Patent Application No. 2009-130804 filed on May 29, 2009 including the specification, drawings and abstract is incorporated herein by reference in its entirety.

BACKGROUND OF THE INVENTION

The present invention relates to a technique of a semiconductor device, particularly a technique applicable effectively to a semiconductor device wherein a semiconductor chip with electrode pads formed thereon is mounted onto a wiring substrate in a state in which its main surface is opposed to a chip mounting surface of the wiring substrate.

In connection with a semiconductor device package there is known a technique wherein a semiconductor chip is flip-chip-mounted onto a wiring substrate. For example, in Japanese Unexamined Patent Publication No. 2003-100801 (Patent Document 1) and No. 2008-218758 (Patent Document 2) is described a so-called flip-chip mounting type semiconductor device wherein a semiconductor chip with electrode pads formed thereon is mounted onto a wiring substrate in such a manner that a main surface of the semiconductor chip confronts a main surface of the wiring substrate as a substrate for mounting the semiconductor chip.

Prior Art Documents

[Patent Document 1]
Japanese Unexamined Patent Publication No. 2003-100801
[Patent Document 2]
Japanese Unexamined Patent Publication No. 2008-218758

SUMMARY OF THE INVENTION

For attaining high speed, high function and reduction of size of a semiconductor device, a so-called flip-chip mounting method is considered to be effective wherein a semiconductor chip with electrode pads formed thereon is mounted onto a wiring substrate in such a manner that a main surface of the semiconductor chip confronts a main surface of the wiring substrate as a substrate for mounting the semiconductor chip.

According to the flip-chip mounting method, a stage for mounting a wiring substrate and a tool for holding a semiconductor chip are each provided with a heat source, and after mounting a semiconductor chip onto the wiring substrate, heat is applied to bonding portions between bump electrodes formed on electrode pads of the semiconductor chip and bonding leads formed on a main surface of the wiring substrate, whereby a soldering material pre-applied onto each of the bonding leads on the wiring substrate wets and rises onto the associated bonding lead to bond the bump electrode and the bonding lead with each other.

Therefore, if the temperature applied to each bonding portion is low, the soldering material becomes difficult to wet and rise onto the bump electrode, with consequent deterioration of the bonding reliability.

This time, the present inventors mounted a semiconductor chip onto a wiring substrate with use of such a flip-chip mounting method and found that bonding defects occurred at the aforesaid bonding portions. Having examined this problem, we found that the problem was caused by a non-uniform layout of the bump electrodes formed on the semiconductor chip to be mounted onto the wiring substrate.

More specifically, in the case of a bump electrode surrounded by (sandwiched in between) other bump electrodes, the bump electrodes disposed next to the bump electrode in question function as heat retaining walls and hence the heat stored in the bump electrode in question becomes difficult to escape, so that the temperature necessary for a soldering material to wet and rise can be maintained. On the other hand, in the case of a bump electrode not surrounded by other bump electrodes, such as, for example, a bump electrode spaced widely from adjacent bump electrodes or a bump electrode disposed at an end of a bump electrode array, heat escapes from the bump electrode in question to the environs, so that the temperature becomes low as compared with the bump electrode onto which the soldering material wets and rises.

In view of this problem the present inventors have made a study about increasing the temperature of the tool and that of the stage. As a result, the wettability of the soldering material for the bump electrodes not surrounded by other bump electrodes was improved, but it was found that a crack was developed in an insulating film formed between a bump electrode-disposed pad with few heat dissipating paths and a corresponding cell.

In this connection the present inventors have made a study about a configuration wherein dummy bumps functioning as heat retaining walls are disposed in gaps and ends of a bump electrode array to suppress variations in temperature between bump electrodes.

However, according to our study, with a mere layout of dummy bumps, there sometimes is a case where, in flip-chip mounting, sufficient heat is not transmitted to the dummy bumps and a bonding portion of a bump adjacent to a dummy bump cannot be fully heat-retained. Moreover, a plurality of wiring lines for electrical coupling between circuit elements and electrode pads are formed on a main surface of a semiconductor chip. In this connection we found that with a mere layout of dummy bumps in gaps and ends of a bump electrode array, there occurred a new problem of short-circuit between adjacent wiring lines and a dummy bump-disposed electrode pad.

The present invention has been accomplished in view of the above-mentioned problems and it is an object of the invention to provide a technique able to improve the reliability of a semiconductor device.

The above and other objects and novel features of the present invention will become apparent from the following description and the accompanying drawings.

Out of the inventions disclosed herein, a typical one will be outlined below.

In one aspect of the present invention there is provided a semiconductor device comprising a wiring substrate, the wiring substrate including an upper surface, a lower surface positioned on the side opposite to the upper surface, a plurality of bonding leads formed over the upper surface, and a plurality of lands formed over the lower surface; a semiconductor chip, the semiconductor chip including a main surface having a quadrangular external shape, a back surface positioned on the side opposite to the main surface, and a plurality of pads formed along each side of the main surface, the semiconductor chip being mounted over the wiring substrate in an opposed state of the main surface to the upper surface of the wiring substrate; and a plurality of conductive members for coupling the pads of the semiconductor chip and the bonding leads of the wiring substrate electrically with each other, wherein the pads include a plurality of first pads and a plurality of second pads, a unique electric current different from an electric current flowing through the second pads flows through the first pads, an electric current common to the pads over the chip main surface flows or does not flow through the second pads, further, next to a certain one of the first pads is disposed another one of the first pads or one of the second pads, the first pads are electrically coupled respectively to the bonding leads through first conductive members out of the conductive members, and the second pads are bonded to the bonding leads through second conductive members out of the conductive members.

The following is a brief description of an effect obtained by the typical invention out of the inventions disclosed herein.

It is possible to reduce the size of a semiconductor device.

DETAILED DESCRIPTION OF THE PREFERRED EMBODIMENTS (Explanation of Description Form, Basic Terms and how to Use)

An embodiment of the present invention will be described dividedly into plural sections or the like where required for convenience' sake, but unless otherwise mentioned, it is to be understood that the divided sections are not independent of each other, but configure portions of a single example, or in a relation such that one is a partial detail of the other or is a modification of part or the whole of the other, irrespective of whether the description of one is before or after the description of the other. As to similar portions, repeated explanations thereof are omitted in principle. Constituent elements in an embodiment are not essential unless otherwise mentioned and except the case where they are limited theoretically to specified numbers thereof, further, except the case where they are clearly essential contextually.

Likewise, in the description of an embodiment or the like, as to "X comprising A" or the like in connection with, for example, a material or a composition, selection of any other element than A as a principal constituent element is not excluded unless otherwise mentioned and except the case where an opposite answer is evident contextually. For example, by the above description is meant "X containing A as a principal component" when viewed from the standpoint of component. For example, "silicon member" is not limited to pure silicon, but it goes without saying that the silicon member in question covers SiGe (silicon-germanium) alloy, other multi-element alloys containing silicon as a principal component, as well as those containing silicon and other additives. Moreover, gold plating, Cu layer and nickel plating are not limited to pure ones unless otherwise mentioned, but it should be understood that they cover members containing gold, Cu, and nickel, respectively, as principal components.

Further, when reference is made to a specific numerical value or quantity, a numerical value larger or smaller than the specific numerical value will also do unless otherwise mentioned and except the case where limitation is made to the specific value theoretically, further, except the case where a negative answer is evident contextually.

In the semiconductor device of this embodiment, semiconductor chips are flip-chip-mounted onto a wiring substrate. As an example of this semiconductor device reference will be made below to a System In Package (SIP) type semiconductor device (hereinafter referred to simply as SIP) wherein a plurality of semiconductor chips of different types (e.g., a memory chip and a controller chip for controlling the memory chip) are mounted on a single wiring substrate to configure a system within a single semiconductor package.

<Outline of Structure of the Semiconductor Device>

Figure 1:
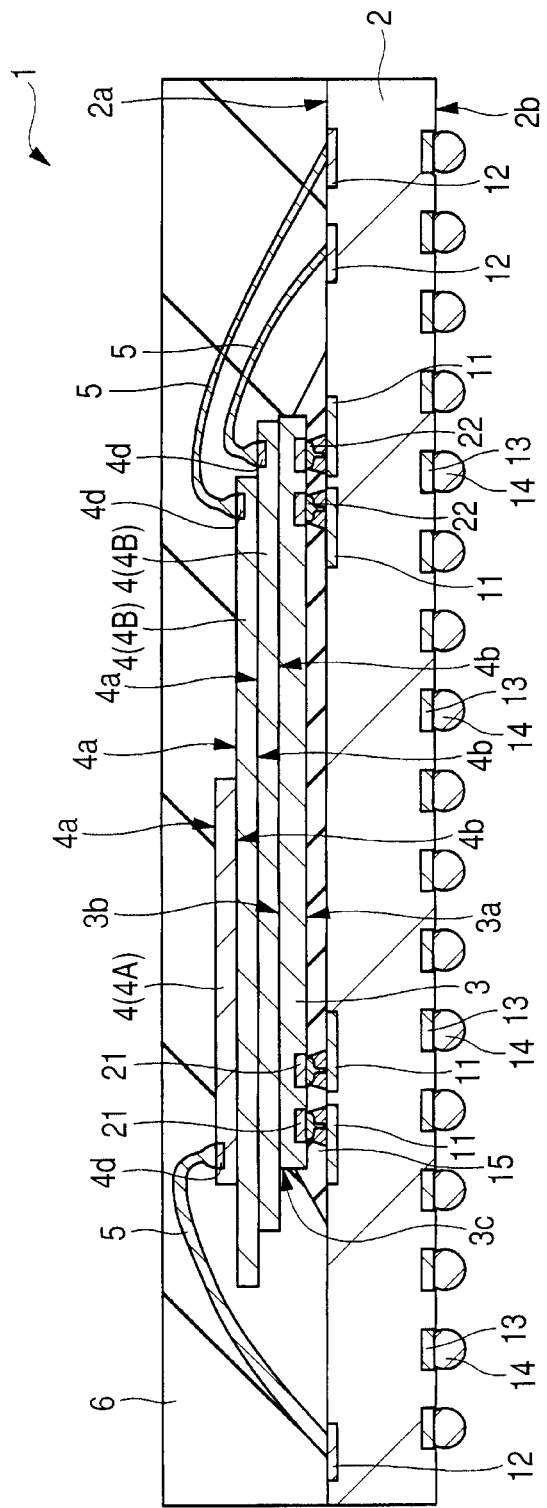
FIG. 1 is a sectional view showing an entire structure of a semiconductor device according to an embodiment of the present invention.

FIG. 1 is a sectional view showing an entire structure of the semiconductor device of this embodiment. In this embodiment a description will be given about an SIP mounted on a mobile phone which is a small-sized terminal device in communication system, as an example of the semiconductor device which the present inventors have studied concretely.

In FIG. 1, an SIP (semiconductor device) 1 includes a wiring substrate 2, the wiring substrate 2 including an upper surface (surface, main surface, chip mounting surface) 2a, a lower surface (back surface) 2b positioned on the side opposite to the upper surface 2a, a plurality of terminals (bonding leads) 11, 12 formed on the upper surface 2a, and a plurality of lands (external terminals) 13 formed on the lower surface 2b. A microcomputer chip (semiconductor chip) 3 is mounted on the upper surface 2a of the wiring substrate 2 in a state in which a main surface 3a thereof is opposed to the upper surface 2a of the wiring substrate 2. The microcomputer chip (semiconductor chip) 3 includes the main surface 3a which has a quadrangular external shape, a back surface 3b positioned on the side opposite to the main surface 3a, and a plurality of pads (electrode pads) 21 formed along each side of the main surface 3a. On the back surface 3b side of the microcomputer chip 3 are mounted memory chips (semiconductor chips) 4 in a state in which back surfaces 4b thereof are opposed to the back surface 3b. The memory chips (semiconductor chips) 4 each include a main surface 4a, the back surface 4b which is positioned on the side opposite to the main surface 4a, and a plurality pads (electrode pads) 4d formed along at least one side of a peripheral edge portion of the main surface 4a.

Circuit elements are formed on the main surface 3a of the microcomputer chip 3 and are coupled electrically to the memory chips 4 or to the lands 13 through wiring lines (including the terminals 11 and 12) formed on the wiring substrate 2. That is, the SPI 1 couples the microcomputer chip 3 as a controlling semiconductor chip and the memory chips 4 electrically with each other through wiring lines formed on the wiring substrate 2 to configure a system.

Figure 2:
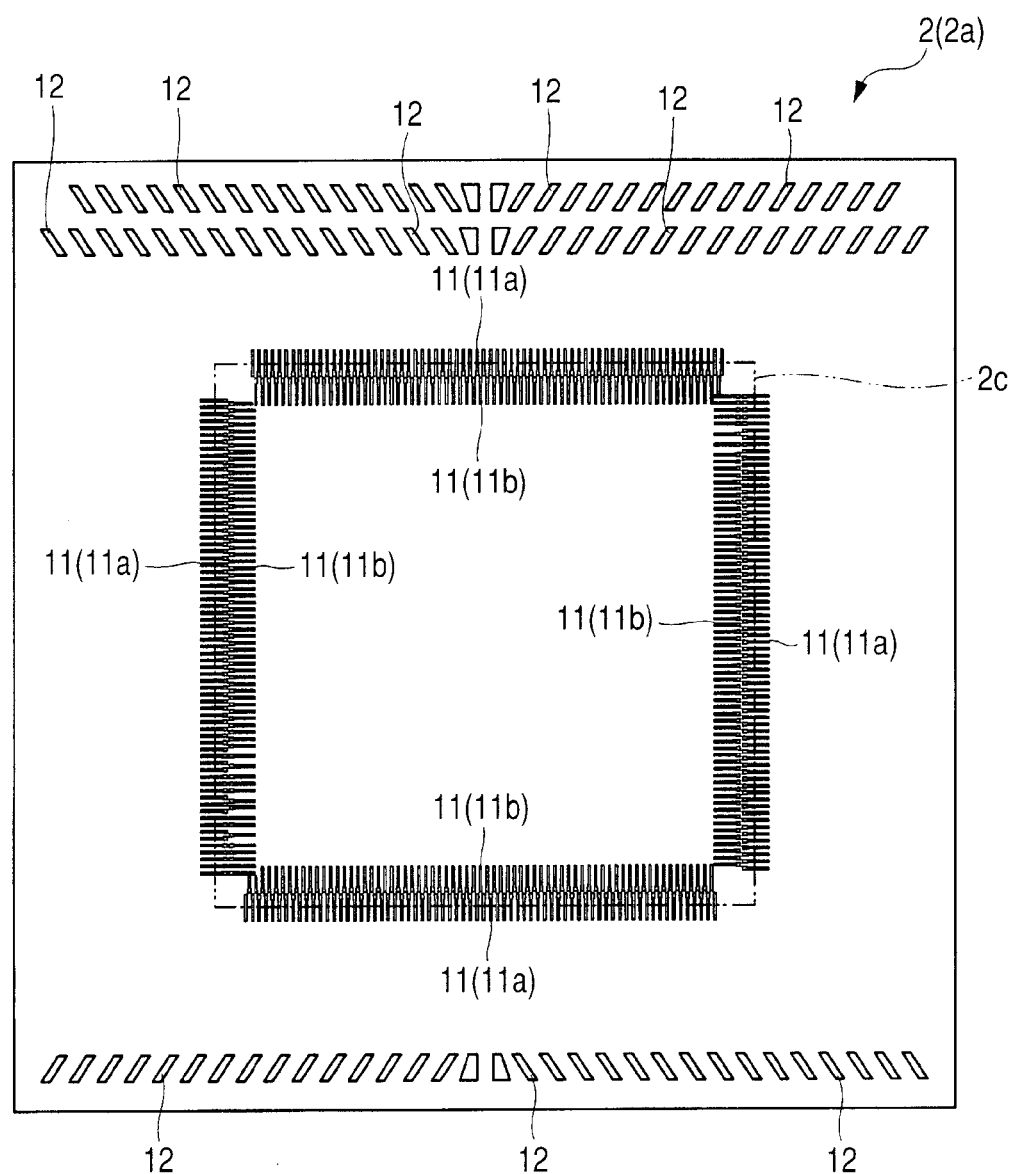
FIG. 2 is a plan view showing an entire structure of an upper surface of a wiring substrate shown in FIG. 1.
Figure 3:
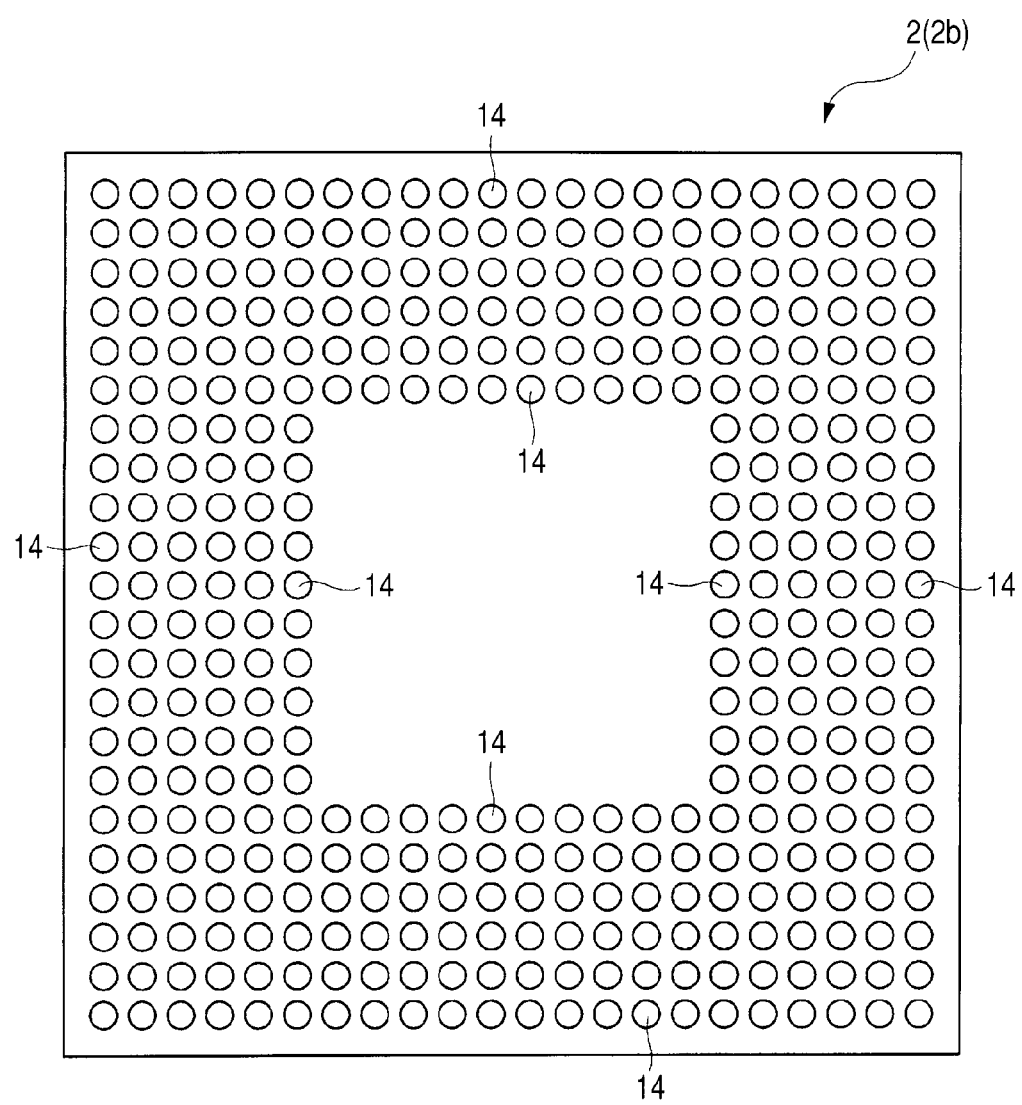
FIG. 3 is a plan view showing an entire structure of a lower surface of the wiring substrate shown in FIG. 1.

FIG. 2 is a plan view showing an entire structure of the upper surface of the wiring substrate shown in FIG. 1 and FIG. 3 is a plan view showing an entire structure of the lower surface of the wiring substrate shown in FIG. 1. The wiring substrate 2 is a multilayer wiring substrate having four wiring layers (a surface wiring layer, a back wiring layer, and two inner wiring layers) fabricated by, for example, a build-up method. Insulating layers for electrically insulating the wiring layers from one another are each formed by, for example, prepreg comprising resin-impregnated glass fiber or carbon fiber. The four wiring layers are each formed by a conductive film containing, for example, copper (Cu) as a principal component. Illustration of these wiring layers is omitted in FIG. 1. Only the terminals 11 and 12 formed on the upper surface 2a of the wiring substrate 2 and the lands 13 for external I/O formed on the lower surface (back surface) 2b of the wiring substrate 2 are shown in FIG. 1.

As shown in FIG. 2, the upper surface 2a of the wiring substrate 2 has a quadrangular plane shape, which is, for example, square in this embodiment. On the surface 2a of the wiring substrate 2 are formed the terminals 11 and 12. In this embodiment, on the upper surface 2a, the terminals 11 and 12 comprise a plurality of terminals 11 disposed in a chip mounting area 2c on the wiring substrate 2 and a plurality of terminals 12 disposed on a peripheral edge portion side of the upper surface 2a with respect to the terminals 11, namely, outside the chip mounting area 2c. As shown in FIG. 1, the terminals 11 are electrically coupled respectively to pads 21 of the microcomputer chip 3 through a plurality of bumps (conductive members, salient electrodes) 22, while the terminals 12 are electrically coupled respectively to the pads 4d of the memory chips 4 through a plurality of wires (conductive members) 5. Of the terminals 11 and 12 disposed on the upper surface 2a shown in FIG. 2, the terminals coupled to the microcomputer chip 3 (see FIG. 1) are disposed inside the chip mounting area 2c. On the other hand, the terminals 12 coupled to the memory chips 4 (see FIG. 1) are disposed outside the chip mounting area 2c, namely, on an outer periphery side with respect to the terminals 11.

The lower surface (back surface) 2b of the wiring substrate 2 shown in FIG. 1 has a quadrangular plane shape, which is, for example, square of the same size as the upper surface 2a in this embodiment. On the lower surface 2b are formed a plurality of lands 13 which are electrically coupled respectively through a wiring layer (not shown) to the terminals 11 and 12 formed on the upper surface 2a. The lands 13 are arranged in plural rows in a matrix shape on the lower surface 2b (see the layout of solder balls 14 shown in FIG. 3). The SIP 1 of this embodiment is a so-called BGA (Ball Grid Array) type semiconductor device wherein solder balls (conductive members, external terminals) 14 for coupling with terminals formed on a packaging substrate (not shown) are arranged (bonded) respectively onto the lands 13 arranged on the lower surface 2b of the wiring substrate 2. However, the structure of external terminals of the SIP 1 is not limited to that of the BGA type. For example, the SIP 1 may be a so-called LGA (Land Grid Array) type semiconductor device wherein the lands 13 are exposed to the lower surface 2b or a solder material in an amount smaller than that of each solder ball used in the BGA type semiconductor device is formed on the surface of each land 13. In BGA or LGA, since the lands 13 are arranged in plural rows in a matrix shape on the lower surface 2b of the wiring substrate 2, it is possible to decrease the packaging area of the semiconductor device the number of whose external terminals has increased to meet the high function requirement.

The solder balls 14 are so-called lead-free solder balls substantially containing no Pb (lead). For example, they are balls of Sn (tin) alone, or Sn (tin)—Bi (bismuth), or Sn (tin)—Ag (silver)—Cu (copper). By the lead-free solder is meant a solder having a lead content of not more than 0.1 wt %. This content is determined as a standard of RoHs (Restriction of Hazardous Substances) instructions. In the following description of this embodiment, when reference is made to solder or solder balls, the solder or solder balls indicate lead-free solder or solder balls unless otherwise mentioned.

Figure 4:
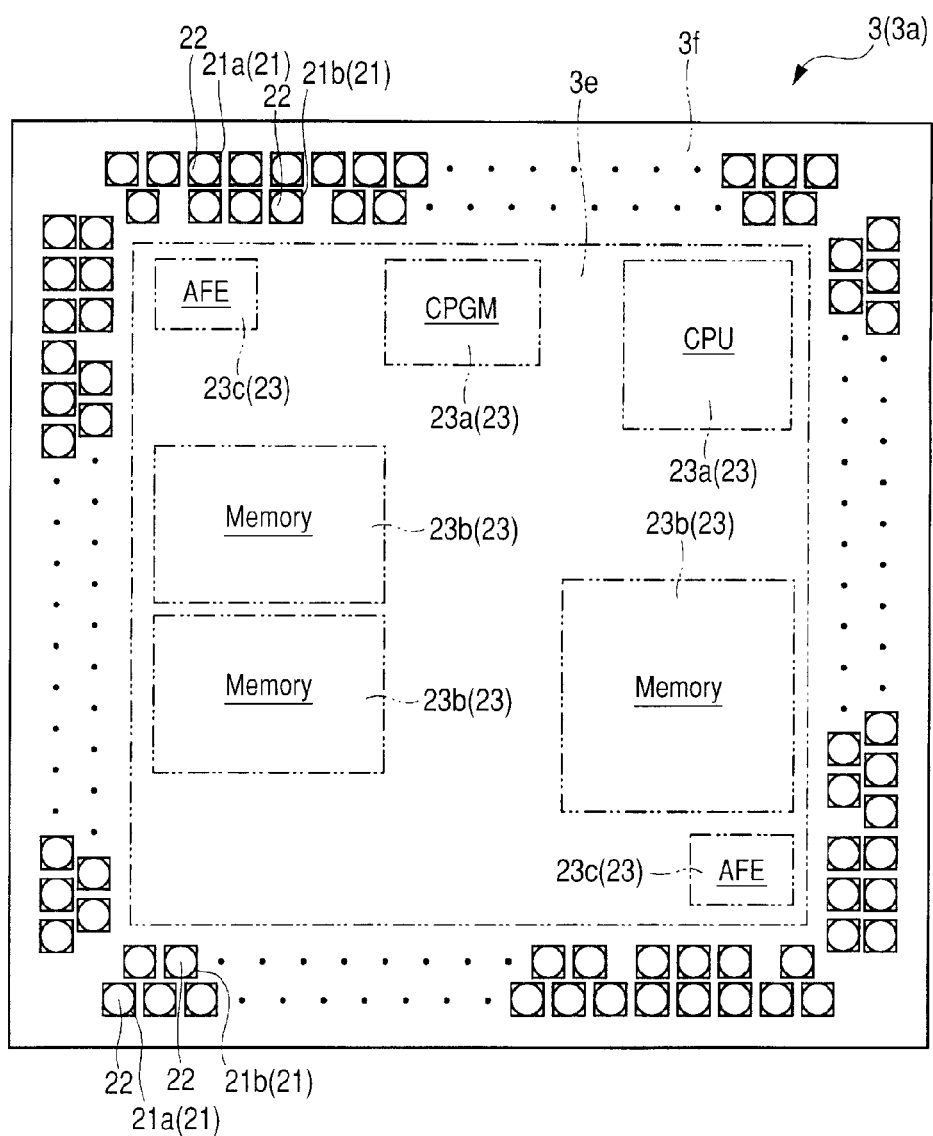
FIG. 4 is a plan view showing schematically an example of layout of circuits and pads formed on a main surface of a microcomputer chip shown in FIG. 1.

FIG. 4 is a plan view showing schematically a layout example of circuits and pads formed on a main surface of the microcomputer chip shown in FIG. 1. The microcomputer chip 3 is mounted on the upper surface 2a of the wiring substrate 2 shown in FIG. 1. As shown in FIG. 1, the microcomputer chip 3 includes the main surface 3a, the back surface 3b positioned on the side opposite to the main surface 3a, and side faces 3c positioned between the main surface 3a and the back surface 3b. The main surface 3a and the back surface 3b have a quadrangular plane shape, which is, for example, square in this embodiment.

As shown in FIG. 4, the main surface 3a of the microcomputer chip 3 includes a core circuit forming area (main circuit forming area, control logic area) 3e positioned inside the main surface 3a and an input-output terminal forming area (input-output circuit, I/O area, I/O cell) 3f disposed in a frame shape along peripheral edge sides of the main surface 3a.

In the core circuit forming area 3e are formed various circuits 23, the circuits 23 comprising control circuit sections 23a such as an arithmetic circuit, e.g., CPU (central processing unit), and a clock pulse generator module (CPGM), memory circuit sections 23b such as cache memories, and analog circuit sections (AFE: Analog Front End) 23c including a power supply circuit, e.g., a DC-AC converter. A core circuit indicates a main circuit in the system including control circuits.

Through wiring lines (not shown) formed in the main surface 3a the circuits 23 are electrically coupled respectively to the pads 21 formed in the input-output terminal forming area 3f. Although one CPU is illustrated in FIG. 4, there sometimes is a case where a plurality of systems (control circuits) adapted to operate each independently are incorporated in one microcomputer chip 3 to meet the demand for higher function and reduction of size for the semiconductor device.

For example, in the case of the SIP 1 which is to be mounted on a mobile phone, a system (control circuit) for controlling a base band transfer function of the mobile phone and a system (control circuit) for controlling an application function are formed in one microcomputer chip 3.

Thus, the microcomputer chip 3 includes a plurality of core circuits (main circuits including control circuits) for controlling the systems concerned. In other words, the microcomputer chip 3 includes plural types of control circuits (e.g., a base band control circuit and an application control circuit). By thus incorporating plural types of control circuits in one microcomputer chip 3 it is possible to reduce the package size of SIP 1 as compared with the case where control circuits are formed in separate semiconductor chips respectively. Each core circuit includes various circuits for system control, configuring a control system. From this standpoint the microcomputer chip 3 is an SOC (System on Chip) comprised of plural integrated circuits formed within a single semiconductor chip.

Thus, the microcomputer chip 3 is a semiconductor chip which forms control circuits. To meet the recent demand for higher function and smaller size of the semiconductor device it is necessary to arrange a large number of input-output terminals (pads 21) while suppressing an increase in plane area of the main surface 3a. Accordingly, the pads 21 are arranged in plural rows (two rows in FIG. 4) along each side which configures an outer edge of the main surface 3a. In other words, in the input-output terminal forming area 3f, first row pads 21a are formed along each side of the main surface 3a of the microcomputer chip 3 and second row pads 21b are formed inside the main surface 3a with respect to the pads 21a.

Figure 26:
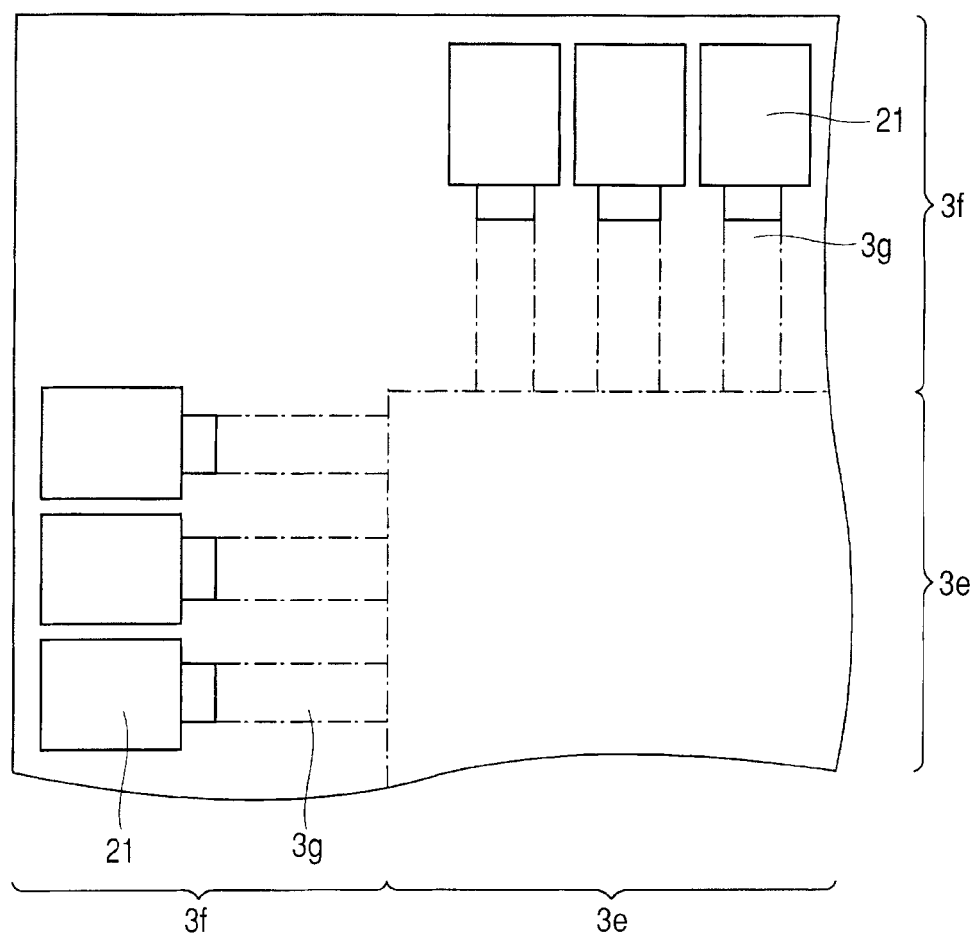
FIG. 26 is an enlarged plan view of a principal portion, showing a reference example of a state of coupling between input-output circuits (I/O cells) and pads.
Figure 27:
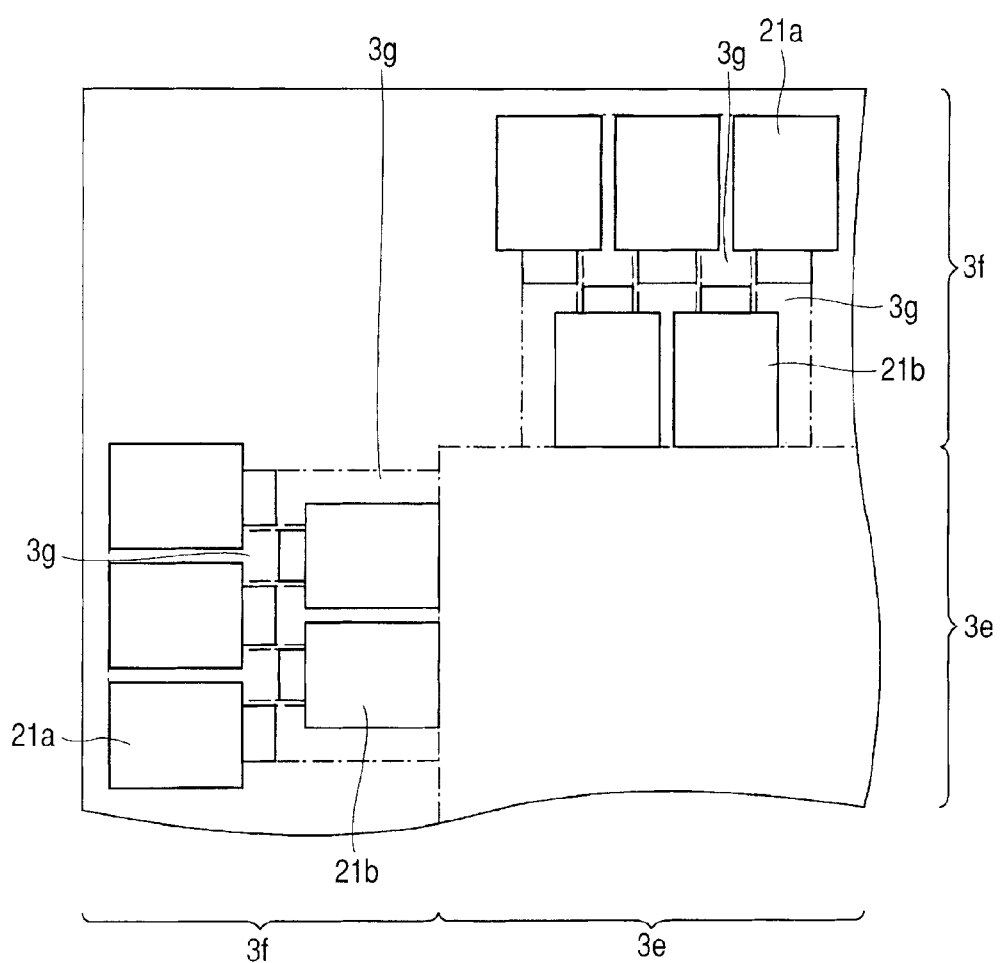
FIG. 27 is an enlarged plan view of a principal portion, showing another reference example of a state of coupling between input-output circuits (I/O cells) and pads.

FIGS. 26 and 27 are each an enlarged plan view of a principal portion, showing a reference example of a state of coupling between input-output circuits (I/O cells) and pads. In this embodiment, as shown in FIG. 26, the width of each input-output circuit is narrower than the width of each pad 21 (in this embodiment it is approximately half of the pad width). Therefore, for efficient coupling between the input-output circuits (I/O cells) 3g and the pads 21 both disposed in the input-output terminal forming area 3f, it is preferable to dispose the pads 21 so that the pitch of the input-output terminals (I/O cells) 3g becomes an equimultiple of the pitch of the pads 21. In case of disposing the pads 21 in plural rows, it is preferable that the pads 21 be arranged in a zigzag fashion as shown in FIG. 27. That is, it is preferable to arrange the pads 21 so that the center of each of the pads 21 located in the first row is positioned on an extension line extending from between two adjacent pads 21b in the second row. In this way a wiring line coupled to a second row pad 21b can be formed between wiring lines coupled to first row pads 21a, whereby it is possible to prevent short-circuit of wiring lines.

Further, from the standpoint of shortening the wiring path distance on the main surface 3a it is preferable that the pads 21 be each disposed near the area where the associated circuit 23 for coupling is formed. Therefore, it is preferable that the pads 21 be disposed between the circuits 23 to which they are coupled electrically on the main surface 3a and the sides which form outer edges of the main surface 3a.

As shown in FIG. 1, the microcomputer chip 3 is mounted on the wiring substrate 2 so that its main surface 3a confronts the upper surface 2a of the wiring substrate 2. The pads 21 formed on the main surface 3a of the microcomputer chip 3 are electrically coupled respectively through the bumps (conductive members, salient electrodes) 22, e.g., gold (Au) bumps, to the terminals 11 formed on the upper surface 2a of the wiring substrate 2. Thus, they are coupled by so-called flip-chip mounting (face-down mounting). According to flip-chip mounting, since the bumps 21 are electrically coupled to the terminals 11 through bumps 22 formed thereon, it is possible to diminish the packaging area on the upper surface 2a of the wiring substrate 2 as compared with face-up mounting wherein the coupling is done through wires. Besides, in electrical coupling to the wiring substrate 2 through bumps, the distance between each pad 21 on the microcomputer chip 3 and the corresponding bonding lead on the wiring substrate can be shortened as compared with electrical coupling through wires, so that it is possible to attain a high speed of the semiconductor device. Moreover, since no terminal is formed on the back surface 3b of the flip-chip-mounted microcomputer chip 3, a semiconductor chip, e.g., memory chip 4, larger in plane area than the microcomputer chip 3 can also be stacked on the back surface 3b. Thus, flip-chip mounting is suitable particularly for the SIP 1 of this embodiment wherein plural semiconductor chips are stacked.

As to the structure related to the layout of wiring lines and pads 21 on the main surface 3a of the microcomputer chip 3, it will be described in detail later.

Underfill resin (sealing resin, sealing body) 15 is disposed between the main surface 3a of the microcomputer chip 3 and the upper surface 2a of the wiring substrate 2 to seal the main surface 3a of the microcomputer chip 3, thereby improving the reliability of bonding between the bumps 22 and the terminals 11. In flip-chip mounting, the microcomputer chip 3 is mounted in a state in which its main surface 3a with pads 21 formed thereon is opposed to the upper surface 2a of the wiring substrate 2. Therefore, by sealing the space between the main surface 3a and the upper surface 2a with underfill resin 15, it is possible to protect the bonding portions between the microcomputer chip 3 and the wiring substrate 2.

The memory chips 4 are mounted onto the back surface 3b side of the microcomputer chip 3. The SIP 1 of this embodiment is a semiconductor device to be mounted on a mobile phone and has plural types of systems adapted to operate independently of each other. For example, it has a system for controlling a base band transfer function of the mobile phone and a system for controlling an application function of the same phone. Separate memory chips 4 are coupled to the systems respectively. Thus, plural memory chips 4 are mounted on the SIP 1. For example, as shown in FIG. 1, the SIP 1 has a memory chip 4A for base band coupled electrically to a base band control circuit and a memory chip 4B for application coupled electrically to an application control circuit.

In the systems which the SIP 1 possesses those memory chips function as main memories, but are different in memory capacity system by system. In this embodiment, for example, as the memory chip 4A for base band there is used one memory chip 4A with a DRAM (Dynamic Random Access Memory) circuit formed thereon, the DRAM circuit having a memory capacity of 512 megabits, while as the memory chip 4B for application there are used two memory chips 4B with a DRAM circuit formed thereon, the DRAM circuit having a memory capacity of 1 gigabits for example. More specifically, in each memory chip 4 is formed a so-called DDR-SDRAM (Double Date Rate-Synchronous Dynamic Random Access Memory) circuit wherein at the time of reading/writing the memory cell array which each memory chip 4 possesses, cells corresponding to 2 bits, 4 bits, or 8 bits, are accessed at a time. The SIP 1 realizes a memory capacity of 2.5 gigabits by stacking three memory chips 4 on the wiring substrate 2, provided the memory capacity and the number of memory chips 4 to be mounted on the wiring substrate 2 may be changed as necessary.

Figure 5:
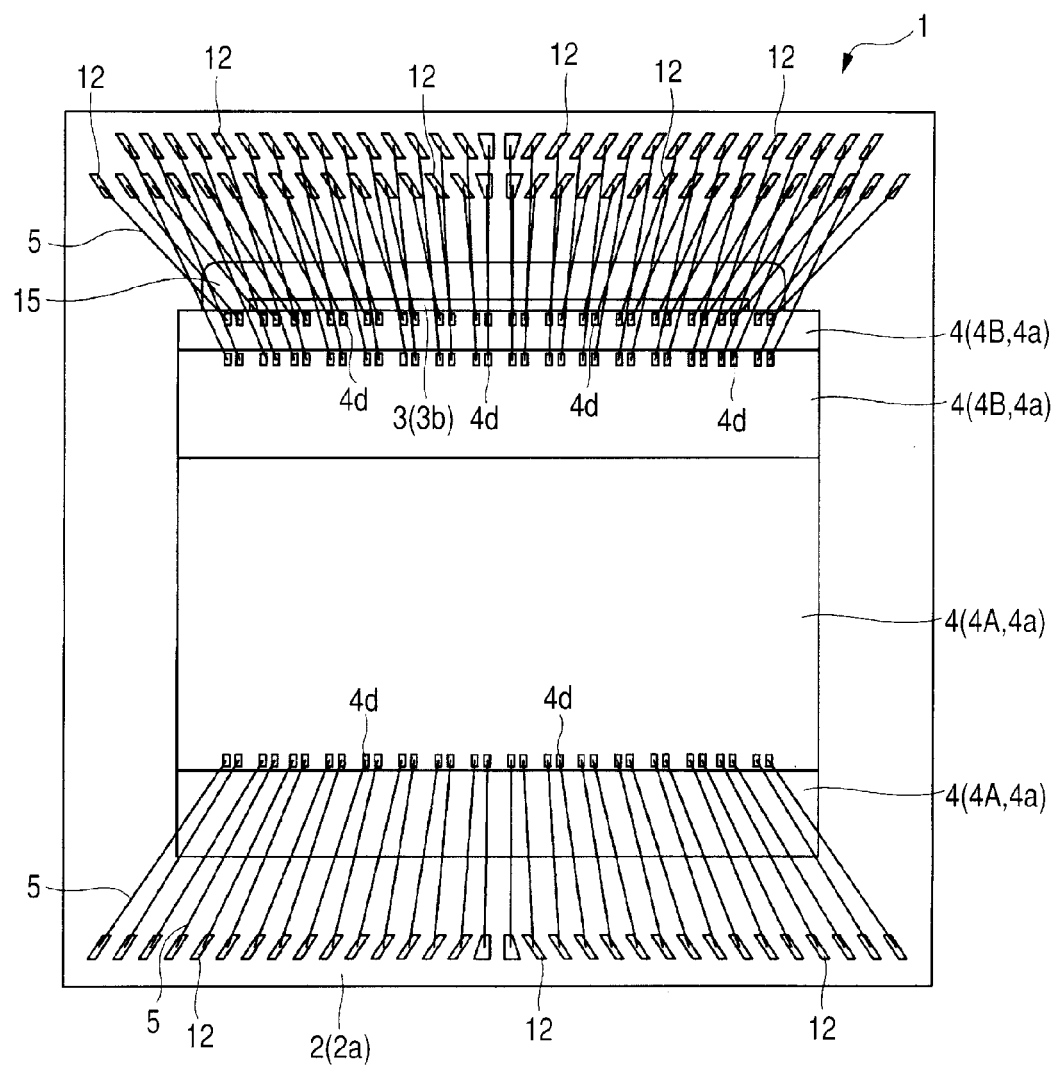
FIG. 5 is a perspective plan view showing, through a sealing body, an internal structure of an upper surface side of the semiconductor device shown in FIG. 1.

FIG. 5 is a perspective plan view showing, through the sealing body, an upper surface-side internal structure of the semiconductor device shown in FIG. 1. As shown in FIG. 1, each memory chip 4 has a main surface 4a, a back surface 4b positioned on the side opposite to the main surface 4a, and side faces positioned between the main surface 4a and the back surface 4b. The main surface 4a and the back surface 4b each have a quadrangular plane shape. The memory capacity of each memory chip 4 is correlated with the area of a memory array. Generally, the larger the area of the main surface 4a, the larger the memory capacity. In this embodiment, therefore, the area of each memory chip 4B is larger than that of the memory chip 4A. Therefore, the memory chips 4B large in area are stacked in lower layers, while the memory chip 4A small in area is stacked in an upper layer, to ensure stability at the time of stacking chips or at the time of wire bonding.

Each memory chip 4 is mounted in such a manner that its back surface 4b confronts the back surface 3b of the microcomputer chip 3 disposed in the bottom layer. That is, face-up mounting is adopted.

The area of the back surface 4b of each memory chip 4B is larger than that of the back surface 3b of the microcomputer chip 3, but the microcomputer chip 3 is flip-chip-mounted and pads or the like are not formed on the back surface 3b. Therefore, by disposing the pads 4d of the memory chips 4B so as to overlap the back surface 3b of the microcomputer chip 3 in the thickness direction, it is possible to ensure stability in wire bonding.

As shown in FIG. 4, a plurality of pads (electrode pads) 4d are formed on the main surface 4a of each memory chip 4a so as to be arranged along one of four sides which configure outer edges of the main surface 4a. The pads 4d are electrically coupled respectively through wires (conductive wires) 5, e.g., gold (Au) wires, to terminals (bonding leads) 12 formed on the upper surface 2a of the wiring substrate 2.

In FIG. 5 there is shown an example in which on the upper surface 2a of the wiring substrate 2 terminals 12 are arranged in one row along one of four sides which configure outer edges of the upper surface 2a and terminals 12 are arranged in two rows along one side opposed to the one side. However, the number of arrangement row(s) of the terminals 12 is not limited to the illustration of FIG. 5, but may be changed as necessary according to the number of terminals in each memory chip 4 or the number of stacks of chips.

As noted above, the memory chips 4 are face-up-mounted and the pads 4d are coupled (bonded) to the terminals 12 through wires 5. Therefore, it is necessary to protect the wires 5 and their bonding portions from the standpoint of preventing conduction defects of the bonding portions and short-circuit of the wires 5. To meet this requirement, a sealing body (sealing resin) 6 is formed on the upper surface 2a of the wiring substrate 2 and the memory chips 4 and the wires 5 are sealed with the sealing body 6.

<Studying Basic Principle of Bonding Defect in Flip-Chip Mounting>

As described above, a system is configured by coupling the pads 21 of the microcomputer chip 3 with the terminals 11 of the wiring substrate 21, also coupling the pads 4d of the memory chips 4 with the terminals 12 of the wiring substrate 2 and further coupling these components through wiring lines formed on the wiring substrate 2. Input and output between the microcomputer chip 3 and external devices are performed by coupling the terminals 11 through wiring liens formed on the wiring substrate 2 to lands 13 or solder balls 14 as external terminals on the lower surface 2b side.

Having made a study, the present inventors found that bonding defects occurred in part of the bonding portions between the pads 21 of the microcomputer chip 3 and the terminals 11 of the wiring substrate 2. More particularly, for example, in an array of pads 21 arranged side by side, bonding defects proved to occur easily particularly at the pads 21 positioned at ends of the array. For example, bonding defects are apt to occur at the pads 21 positioned closest to the corners of the main surface 3a shown in FIG. 4. Further, for example, at juxtaposed pads 21, in the case where the layout pitch of certain such pads becomes wider than that of the other pads and a wide gap occurs between adjacent pads 21, a bonding defect is apt to occur at the pad 21 positioned closest to the gap.

Figure 6:
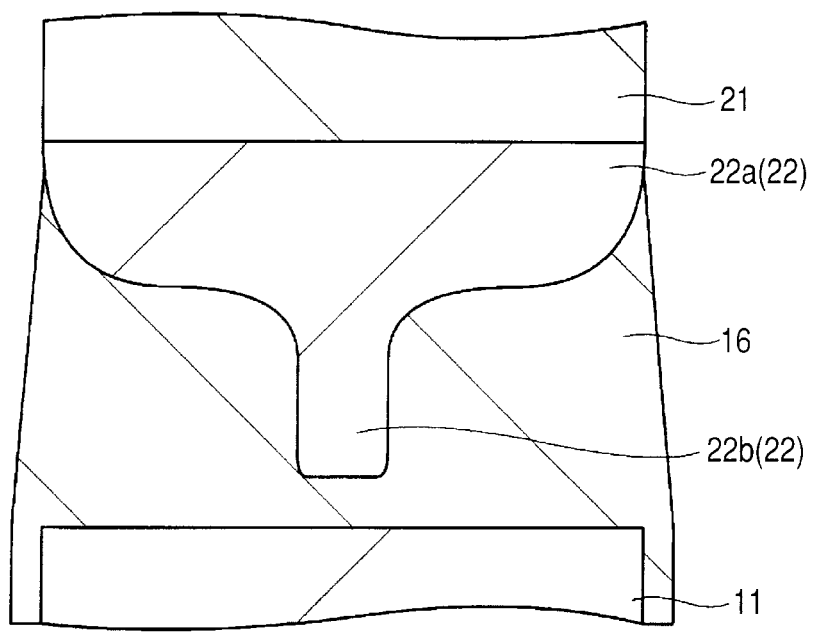
FIG. 6 is an enlarged sectional view showing a detailed structure of a bonding portion between a pad on the microcomputer chip and a terminal on the wiring substrate both shown in FIG. 1.
Figure 7:
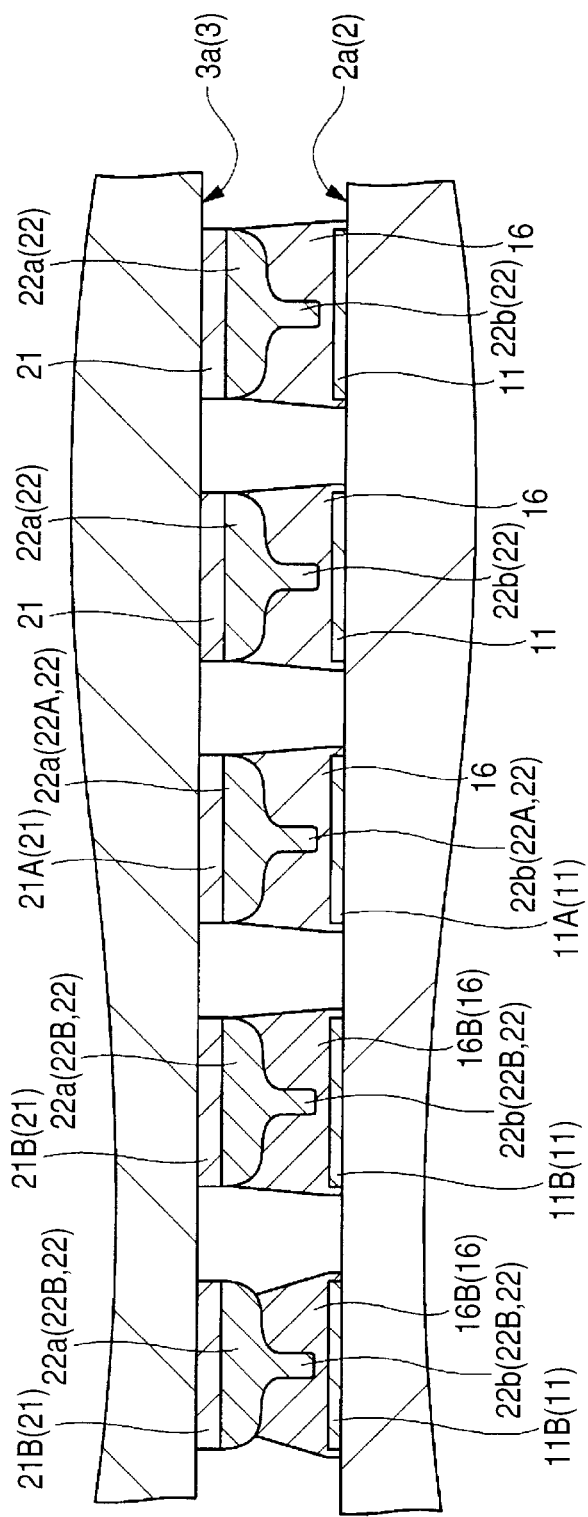
FIG. 7 is an enlarged sectional view of a principal portion, showing on a larger scale a part of a section in an array direction of pads of the microcomputer chip in the semiconductor device shown in FIG. 1.

A description will now be given about the cause of occurrence of such bonding defect which the present inventors found out as a result of study on the phenomenon in question. FIG. 6 is an enlarged sectional view showing a detailed structure of bonding portions between microcomputer chip pads and wiring substrate terminals both shown in FIG. 1. FIG. 7 is an enlarged sectional view of a principal portion, showing on a larger scale a part of a section taken in the pad layout direction of the microcomputer chip in the semiconductor device shown in FIG. 1. In FIG. 7 there is shown only a principal portion necessary for explanation in order to make the figure easy to see. For example, the underfill resin shown in FIG. 1 is not shown in FIG. 7.

In FIG. 6, an electrical coupling between a pad 21 and a terminal 11 is effected by a so-called gold-solder coupling, namely, coupling between a bump 22 bonded to the surface of the pad 21 and solder 16 disposed (bonded) onto the surface of the terminal 11.

The bump 22 is a so-called stud bump formed by discharge-melting one end portion of a gold wire to form a ball portion 22a, then bonding the ball portion 22a to the surface of the pad 21 by, for example, ultrasonic wave, and then cutting the other end portion of the wire. Consequently, a thinner wire portion 22b than the ball portion 22a is formed at the tip of the bump 22.

In the gold-solder bonding, the bonding portion between the bump 22 and the solder 16 is heated to melt the solder 16, the thus-melted solder 16 wets and rises from the wire portion 22b of the bump 22 up to the ball portion 22a, whereby a strong bonding is obtained. Therefore, when such wetting and rising of the solder 16 is poor and, for example, when the solder 16 does not wet and rise up to contact with the ball portion 22a, the bonding strength of the gold-solder bonding decreases. As a result, for example under an external force such as a shock applied during manufacture, the bonded portion becomes easy to break and the bonding reliability is deteriorated.

The wetting and rising characteristic (wettability) of the solder 16 depends on the bonding temperature. That is, in the case where the bonding temperature is not sufficiently high in comparison with the melting point (e.g., about 220° C.) of the solder 16, the wettability of the solder is deteriorated, so that the bonding reliability is apt to become lower. On the other hand, in the case where the bonding temperature is set extremely high in comparison with the melting point of the solder 16, there will occur a bonding defect for another reason. According to a study made by the present inventors, for example if the temperature near bonding portions is set at 320° C., a crack is developed in the insulating film near the bonding portions. Or, as a result of an increase in the amount of warping of the wiring substrate 2 (see FIG. 1) due to a high bonding temperature, stress is concentrated on a certain bonding portion, resulting in breakage of the bonding portion. Thus, for suppressing the deterioration of bonding reliability in gold-solder bonding it is necessary that the environs of bonding portions be controlled to within an appropriate temperature range. Therefore, as shown in FIG. 4, when plural pads 21 are disposed on the main surface 3a and the bumps 22 bonded to the pads 21 respectively are to be bonded at a time to the terminals (see FIG. 1) of the wiring substrate 2 (see FIG. 1), it is necessary that the surrounding temperatures of the bonding portions be all set to within a predetermined temperature range.

That is, as noted above, the phenomenon that bonding defects are apt to occur particularly at the pads 21 positioned at array ends is presumed to be because of a lowering in wettability of the solder 16 shown in FIG. 6 due to the surrounding temperature of the bumps 22 positioned at array ends being lower than that near the bonding portions of the other bumps 22.

On the basis of the above knowledge the present inventors have made a study about the technique for suppressing variations in temperature distribution around bonding portions of plural bumps 22. First, taking note of the fact that bonding defects are apt to occur at array ends, the present inventors have made a study about a heat retaining effect obtained by an adjacent pad 21 or bump 22 when plural pads 21 are arranged side by side. More particularly, in connection with FIG. 7, the present inventors have made a study about the following cases [1] to [3]: in adjacency to pad 21A, bump 22A and terminal 11A which are positioned at an array end, [1] a case where a pad (heat retaining pad, dummy pad) 21B alone is further disposed, [2] a case where on the pad 21B is formed a bump (heat retaining bump, dummy bump) 22B, or both bump 22 and terminal 11B are formed, and [3] a case where a bump 22B is formed on the pad 21B, and at the position opposed thereto is disposed a terminal (heat retaining terminal, dummy terminal) 11B coated on its surface with solder (heat retaining solder, dummy solder, conductive member) 16B.

As a result of the study, with the disposition of only the pad 21B as in the above [1] and with a mere formation thereon of the bump 22B or both bump 22 and terminal 11B as in the above [2], there was not obtained any significant heat retaining effect in comparison with the case where the pad 21B is not disposed. However, when bump 22B was formed on the pad 21B and the terminal 11B coated on its surface with solder 16B was disposed at the position opposed to the bump 22B as in the above [3], it was possible to suppress the drop of temperature near the bonding portion of the bump 22A positioned at an array end. It is presumed that this is for the following reason.

Since the bump 22A positioned at an array end is small in the number of heat sources disposed therearound in comparison with the other bumps 22, a temperature difference from the temperature around the bumps 22 becomes larger and the temperature of the bump 22A is apt to drop. The temperature around solder (conductive member) 16A bonded to the bump 22A is important for improving the wettability of the solder 16A. However, with the disposition of only the pad 21B as in [1], the temperature of the bump 22A positioned at an array end is little retained because a bump 22 serving as a heat retaining wall is not formed. With formation of only the bump 22B on the pad 21B as in [2], the temperature of the bump 22B becomes low and the temperature of the bump 22A positioned at an array end drops, because the bump 22B is not thermally coupled to the wiring substrate. In case of forming a terminal 11B in contact with the bump 22B, the bump 22B also serves as a heat source. However, the portion which functions as a heat source is only the wire portion 22b thinner than the ball portion 22a. Since the heat capacity of the wire portion 22b is smaller than that of the ball portion 22a, the surrounding temperature cannot be retained to a satisfactory extent.

On the other hand, when solder 16B of the same material as that of the solder 16A bonded to the bump 22A, as well as the terminal 11B, are disposed at the position opposed to the bump 22B, the portion from the pad 21B to the terminal 11B functions as an integral heat retaining wall, whereby it is possible to suppress a temperature drop of the adjacent bump 22A.

In flip-chip mounting, heat sources such as heaters are disposed on both lower surface 2b side of the wiring substrate 2 and the back surface 3b side of the microcomputer chip 3, which are shown in FIG. 1, to effect heating. Therefore, when there are disposed only the pad 21B and the bump 22B bonded thereto, the heater disposed on the lower surface 2b side of the wiring substrate 2 cannot be effectively utilized as a heat source because the tip of the bump 22B is not thermally coupled to a member on the wiring substrate 2 side. On the other hand, when the solder 16B and the terminal 11B are disposed at the position opposed to the bump 22B, the solder 16B and the bump 22B are bonded and hence thermally coupled with each other. As a result, the heater disposed on the lower surface 2b side of the wiring substrate 2 can also be utilized effectively as a heat source.

By "thermally coupled" is meant a state in which by bonding different members such as, for example, bump 22B and solder 16B with each other it is possible to effect heat exchange up to a degree of both members' temperatures becoming equal to each other. Therefore, the strength of bonding between the bump 22B and the solder 16B, which is required from the thermally coupling standpoint, is lower than the bonding strength required from the standpoint of electrical coupling reliability. For example, when the strength of bonding between a bump 22 with a signal current flowing therethrough in the SIP 1 and the solder 16 is low, it is necessary for the solder 16 to surely wet and rise up to a degree of covering the ball portion 22a of the bump 22 because otherwise the occurrence of noise due to an increase of impedance component or breaking of wire would result (see the solder (first conductive member) 16A in FIG. 7). Also in case of disposing the bump 22B and solder 16B shown in FIG. 7 for the purpose of retaining heat, it is preferable for the solder 16B to wet and rise up to a degree of covering the ball portion 22a of the bump 22B. However, heat exchange between the bump 22B and the solder 16B can be done for example even when the solder 16B is merely in contact with part of the ball portion 22a. Therefore, like the solder (second conductive member) 16B formed between the bump 22B and the terminal 11B positioned at the leftmost end in FIG. 7, the solder shape may be different from the shape of the solder (first conductive member) 16A which has wet and risen up to the ball portion 22a of the bump 22A.

From the above results of our study it turned out that the temperature drop of a bump 22 adjacent to the bump 22A positioned at an array end could be suppressed by further disposing pad 21B, bump 22B, solder 16B and terminal 11B, serving as a heat retaining wall, next to the array end bump 22A, and by bonding the bump 22 and the terminal 11 with each other.

If the pad 21B, bump 22B, solder 16B and terminal 11B are disposed each at least one next to the bump 22A, there can be obtained a heat retaining effect. As shown in FIG. 7, however, the heat retaining effect is further enhanced by disposing plural pads 21B, bumps 22B, solders 16B and terminals 11B. This is because the temperature of the bump 22B and that of the solder 16B adjacent to the bump 22A are retained and hence the wettability of the solder 16B is improved. Thus, it is particularly preferred to dispose plural such components taking into account the number of pads required of the microcomputer chip 3 or the wiring layout of the upper surface 2a of the wiring substrate 2.

As to the terminal 11B, in the case of the above layout aiming mainly at the heat retaining effect, it is optional whether the terminal 11B is coupled or not through a wiring line to a land 13 formed on the lower surface 2b of the wiring substrate 2. As noted above, however, in flip-chip mounting and in case of disposing a heat source such as a heater on the lower surface 2b of the wiring substrate 2 to effect heating, coupling through a wiring line between the land 13 and the terminal 11B makes the temperature of the terminal 11B easier to rise. This is because a material, e.g., copper, high in thermal conductivity as compared with the insulating layer material of the wiring substrate is used as the wiring material. Thus, from this standpoint it is preferable that the terminal 11B be coupled to the land 13 through a wiring line.

In case of coupling between the land 13 and the terminal 11B electrically through a wiring line, the pad 21B can also be used, for example, as a terminal for the supply of a supply potential or a reference potential. As to the supply potential and the reference potential, there sometimes is a case where a common electric current flows through plural pads 21 from the standpoint of diminishing the impedance component such as wiring resistance. However, the impedance component can be further diminished by flowing a supply potential current or a reference potential current through the pad 21B. Also as to a signal current, in case of flowing a common signal current to plural pads 21, a signal current common to other pads 21 can be flowed in the pad 21B. However, since the strength of bonding between the pump 22B and the solder 16B disposed on the pad 21B is apt to become lower than the other bump 22-solder 16 bonding strength, it is preferable not to flow a signal current in the pad 21B from the standpoint of preventing noise. That is, in case of flowing an electric current common to other pads 21 through the pad 21B, it is preferable that the common current be a supply potential current or a reference potential current. In the case of a unique electric current different from the electric current flowing through other pads 21, it is impossible to let such unique current flow through the pad 21B. This is because, as noted above, the bonding portion strength is weak and hence the occurrence of a bonding defect leads to a lowering in reliability of the semiconductor device.

For electrical coupling between the land 13 and the terminal 11B through a wiring line it is necessary to ensure a space for disposing a wiring path. Therefore, from the standpoint of reducing the size (plane area of the upper surface 2a) of the wiring substrate 2 it is preferable that the terminal 11B be not coupled to the land 13, that is, no electric current be flowed in the pad 21B.

<Application to Semiconductor Chip with Plural Rows of Pads arranged on Main Surface-1>

In this embodiment, as shown in FIG. 4, pads 21 are arranged in plural rows on the main surface 3a of the microcomputer chip 3. From the standpoint of preventing a drop of the surrounding temperature of the bumps 22 in flip-chip mounting described above, such a layout in plural rows as shown in FIG. 4 is preferable to a one row layout. In case of disposing pads 21 of a quadrangular external shape in plural rows, for example in FIG. 4, a first row of pads 21a and a second row of pads 21b are arranged in such a manner that inner sides of the first row of pads 21a disposed on an outer periphery side of the main surface 3a and outer sides of the second row of pads 21b disposed inside the pads 21a are opposed to each other. Further, as shown in FIG. 6, a bump 22 is disposed on each pad 21 and a terminal 11 formed with solder 16 on the surface thereof is disposed at the position opposed to the pad 21. By disposing the pad 21, bump 22, solder 16 and terminal 11 in such a mutually opposed manner, it is possible to diminish heat dissipating paths from the bonding portion corresponding to each pad 21 and hence possible to prevent a temperature drop. That is, the bump 22 and solder 16 coupled to each of the pads 21a and 21b, i.e., one bonding portion, functions as a heat retaining wall for the other.

Accordingly, from the standpoint of regulating temperature distributions of the bonding portions coupled respectively to plural pads 21 to within a certain range, it is preferable that the pads 21a disposed on the outer periphery side and the pads 21b disposed inside the pads 21a be opposed to each other. This is for regulating the degree of heat retaining effect in the bonding portions coupled to the pads 21.

However, as a result of a study made by the present inventors it turned out that it was difficult to arrange the pads regularly in a zigzag fashion and that this was attributable to the wiring layout on the upper surface 2a of the wiring substrate 2 or to the easiness of coupling for example between the analog circuit sections 23c and the pads 21a (or pads 21b) in the core circuit forming area 3e. This point will be described below concretely.

Figure 8:
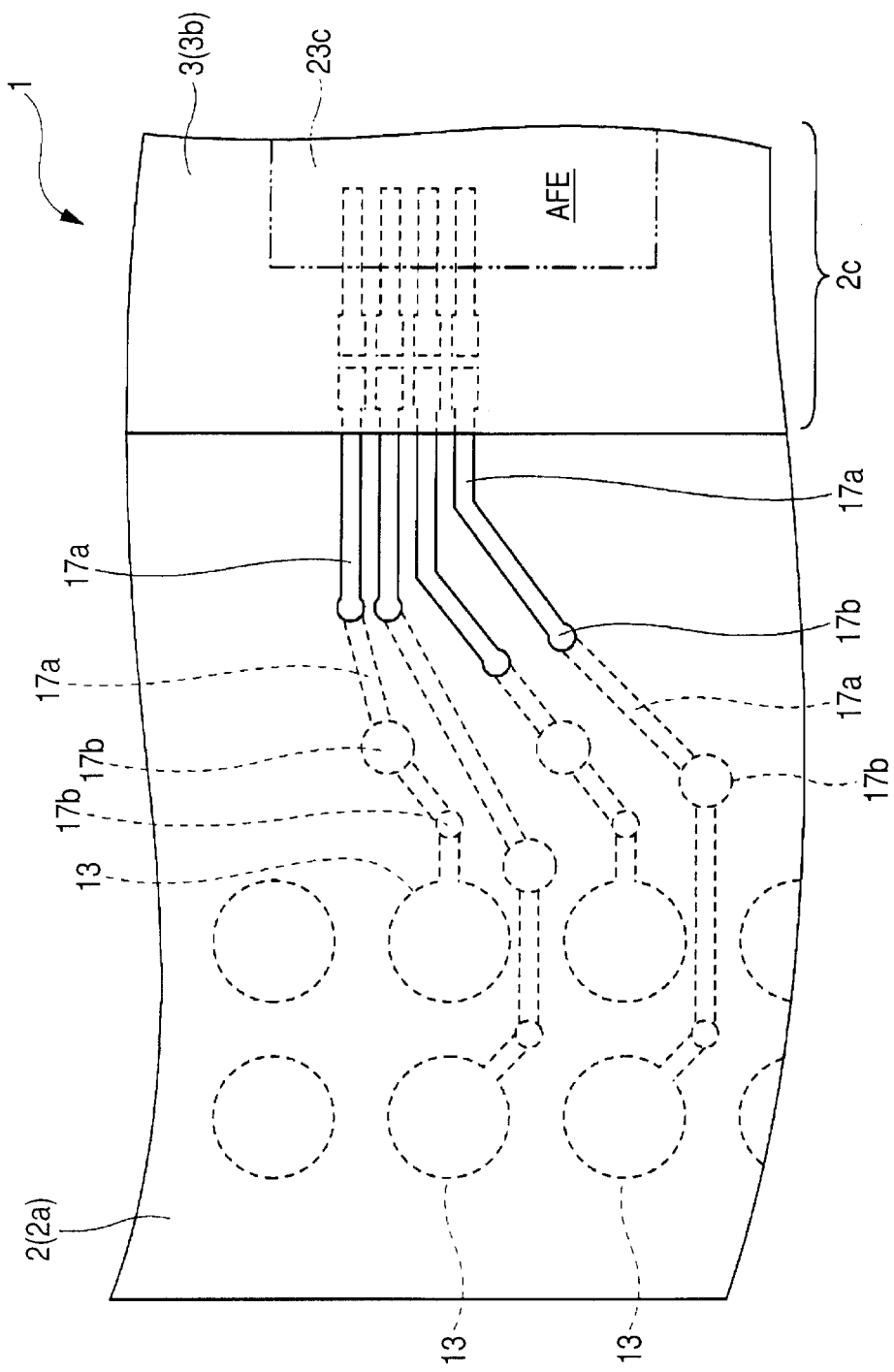
FIG. 8 is an enlarged perspective plan view of a principal portion, showing an example of wiring paths coupled to an analog circuit section of the microcomputer chip in the semiconductor device shown in FIG. 1.
Figure 9:
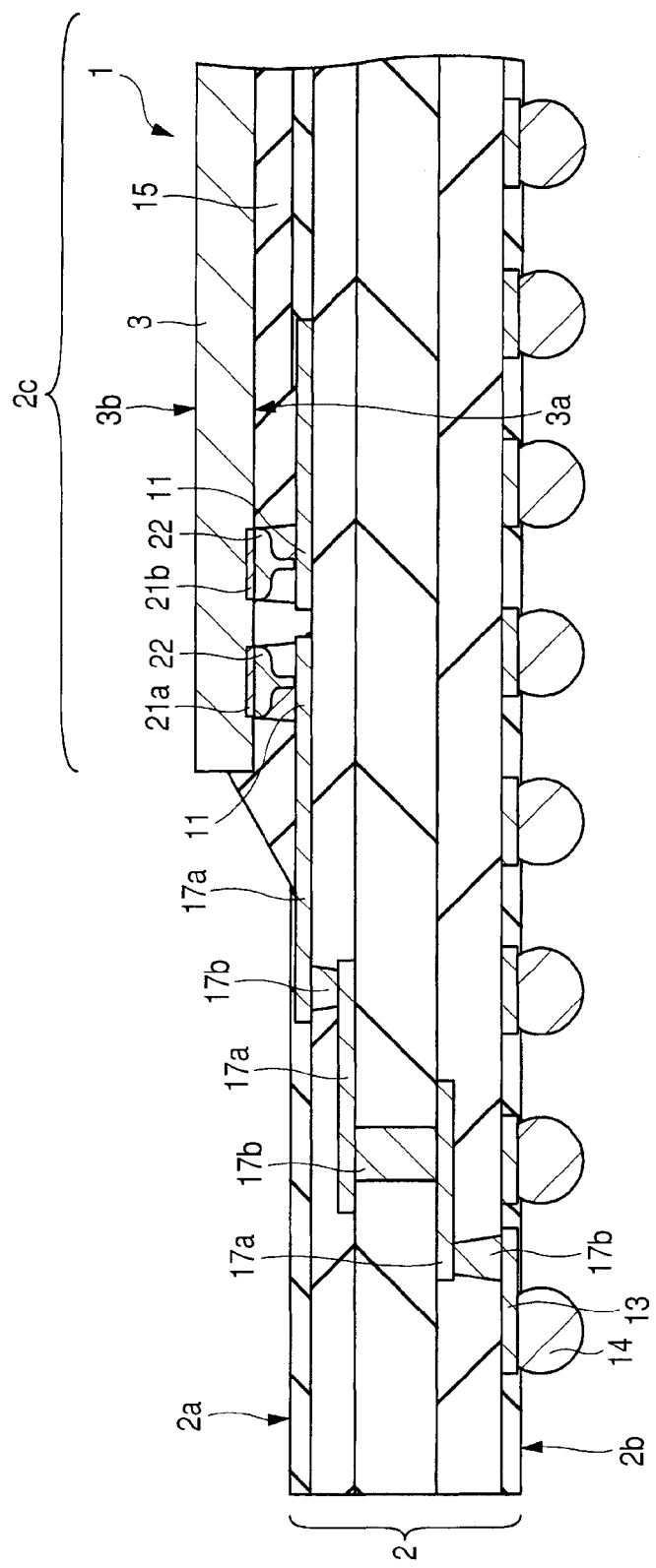
FIG. 9 is an enlarged sectional view of a principal portion of the wiring paths shown in FIG. 8.
Figure 10:
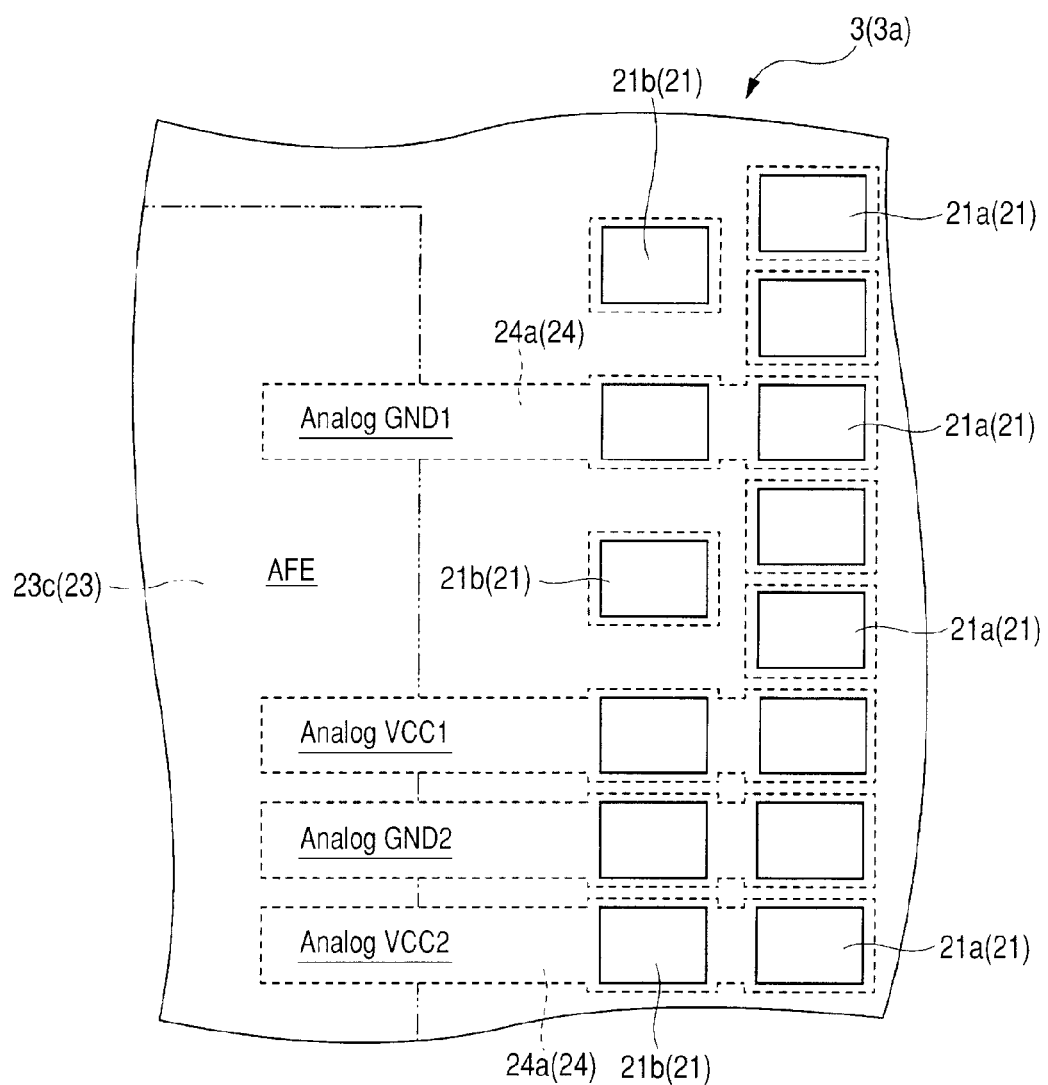
FIG. 10 is an enlarged plan view of a principal portion, showing an example of a wiring layout around the analog circuit section on the main surface of the microcomputer chip shown in FIG. 4.
Figure 28:
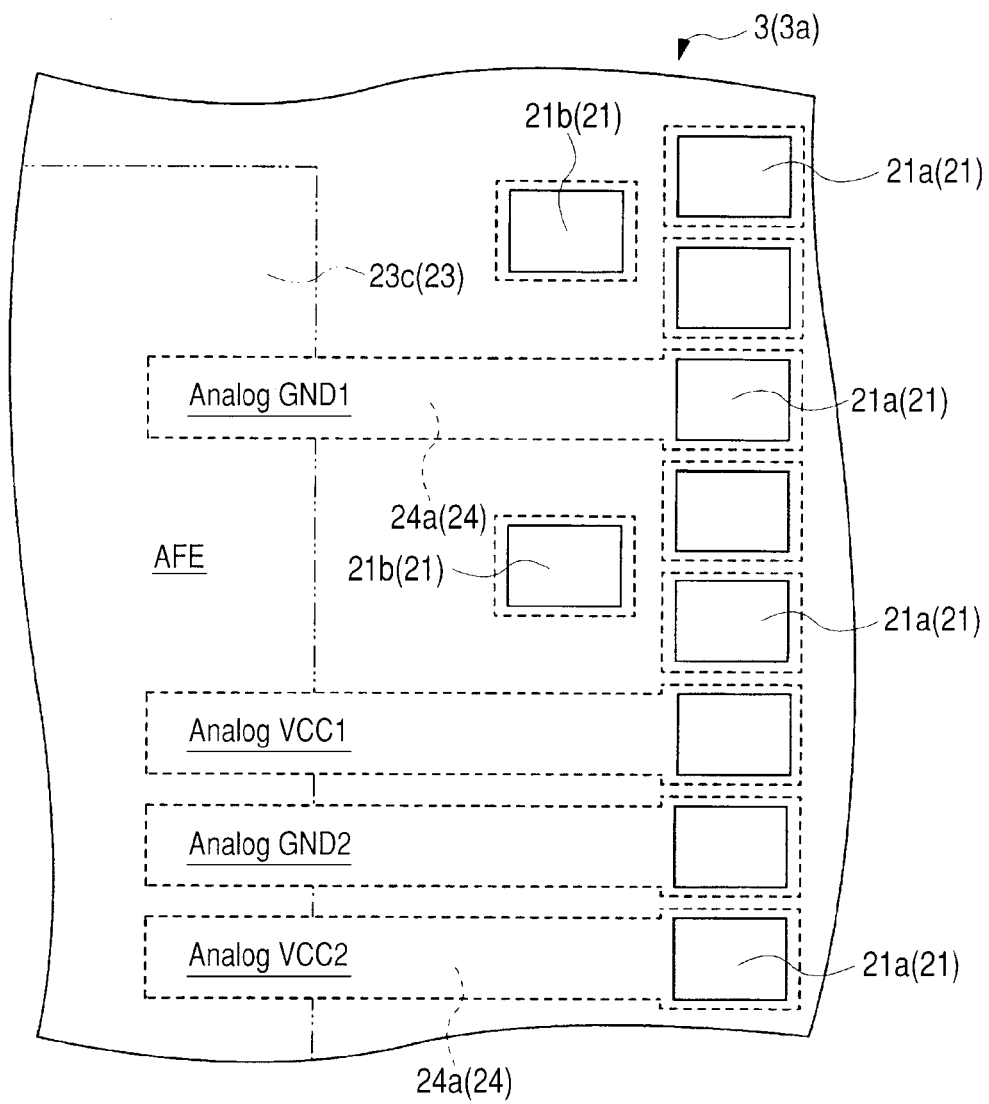
FIG. 28 is an enlarged plan view of a principal portion, showing an example of a wiring layout around an analog circuit section on a main surface of a microcomputer chip as a comparative example in comparison with FIG. 10.
Figure 29:
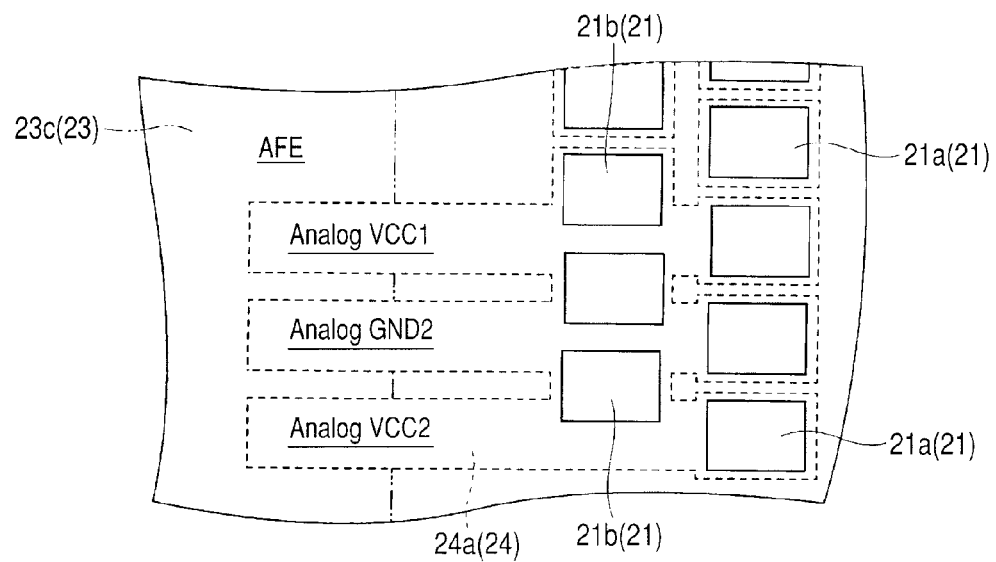
FIG. 29 is an enlarged plan view of a principal portion, showing another example of a wiring layout around the analog circuit section on the main surface of the microcomputer chip as another comparative example in comparison with FIG. 10.
Figure 30:
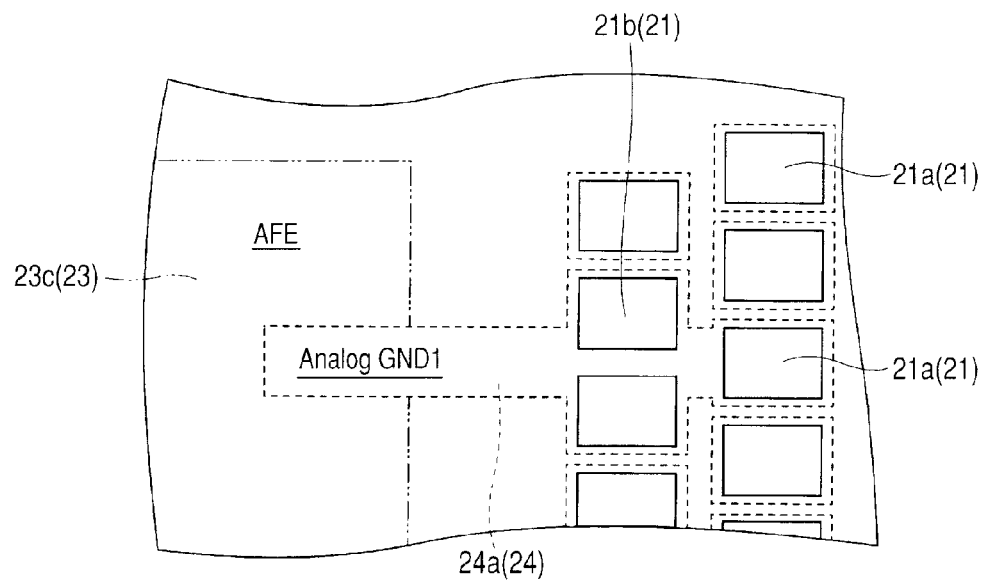
FIG. 30 is an enlarged plan view of a principal portion, showing a further example of a wiring layout around the analog circuit section on the main surface of the semiconductor chip as a further comparative example in comparison with FIG. 10.

FIG. 8 is an enlarged perspective plan view of a principal portion, showing an example of wiring paths coupled to an analog circuit section of the microcomputer chip in the semiconductor device shown in FIG. 1, and FIG. 9 is an enlarged sectional view thereof. FIG. 10 is an enlarged plan view of a principal portion, showing an example of a wiring layout around the analog circuit section on the main surface of the microcomputer chip shown in FIG. 4. FIGS. 28, 29 and 30 are enlarged plan views of a principal portion, showing wiring layouts around an analog circuit section on a main surface of a semiconductor chip as examples comparative with the embodiment of the present invention. In FIG. 8, a portion of the lands 13 formed on the lower surface 2b are shown in a see-through manner in order to show a planar layout of wiring paths extending from the upper surface 2a of the wiring substrate 2 to the lower surface 2a of the same substrate.

The SIP 1 shown in FIG. 1 is mounted on a packaging substrate such as, for example, a mother board of a mobile phone and is coupled to external devices electrically. On the packaging substrate, since for example various electronic devices are mounted side by side, the external devices coupled electrically to the SIP 1 are mounted outside the area where the SIP 1 is mounted.

An increase of the impedance component in the wiring paths coupled to various circuits of the microcomputer chip 3 causes the occurrence of noise and a lowering of the power consumption efficiency. Particularly, in comparison with a digital circuit, the analog circuit is apt to be influenced by an increase of the impedance component. Therefore, as to the wiring paths coupled to the analog circuit it is preferable from the standpoint of diminishing the impedance component that the wiring path distance be made short and that the wiring width be made large. Further, from the standpoint of reducing external dimensions of the microcomputer chip 3 or the SIP 1 it is preferable to minimize the number of pads which supply the supply potential or the reference potential to the analog circuit. Also from this standpoint it is necessary to decrease the resistance value of the wiring paths coupled to the analog circuit.

For example, the lands 13 which supply the supply potential or the reference potential to the analog circuit section 23c shown in FIG. 8 are coupled to external devices disposed outside the SIP 1-mounted area on the packaging substrate. Therefore, from the standpoint of shortening the wiring path distance from the SIP 1 to the external devices the lands 13 are disposed in an outer periphery-side row on the lower surface 2b of the wiring substrate 2 (see FIG. 9). Also as to the wiring paths formed on the wiring substrate 2, the terminals 11 coupled to the analog circuit section 23c are disposed on an outer periphery side in order to shorten the wiring path distance. That is, wiring lines are drawn out toward an outer periphery side of the wiring substrate 2 from the terminals 11 disposed on the outer periphery side out of the terminals 11 for flip-chip coupling. Therefore, as to the wiring paths coupled to the analog circuit section 23c, wiring lines 17a formed on the wiring substrate 2 shown in FIG. 9 extend outwards from the chip mounting area 2c and vias 17b as interlayer conduction paths are disposed outside the chip mounting area 2c. With this arrangement, it is possible to diminish the impedance component of the wiring paths coupled to the analog circuit section 23c. Also on the main surface 3a of the microcomputer chip 3, as shown in FIG. 28, the pads 21 for electrical coupling between the analog circuit 23 and the lands 13 are disposed on the outer periphery side of the main surface 3a. Further, from the standpoint of diminishing the impedance component, it is preferable that the coupling between the analog circuit section 23c and the pads 21 disposed on the outer periphery side of the main surface 3a be done using thick wiring lines such as wiring lines 24a shown in FIG. 28 (e.g., "Analog GND1" shown in FIG. 28).

As noted above, from the standpoint of regulating temperature distributions in the bonding portions coupled to plural pads 21 respectively to within a certain range, it is preferable that, as shown in FIG. 10, the pads 21a disposed on the outer periphery side and the pads 21b disposed inside the pads 21a be opposed to each other.

However, as shown in FIG. 29, if the outer periphery pads 21a and the inner periphery pads 21b are disposed in a zigzag fashion such that central positions of opposed sides of both pads are deviated from each other, the pads 21b overlap plural wiring lines 24 on the microcomputer chip 3. That is, as a result of disposing the pads 21b and 21a in a zigzag fashion, plural wiring lines on the microcomputer chip 3 are shorted through pads 21b. Besides, as noted above, from the standpoint of reducing the external dimensions of the microcomputer chip 3 or the SIP 1 it is preferable to minimize the number of the pads 21 coupled to the analog circuit section 23c. Therefore, as to wiring lines 24 adjacent to each other, different electric currents are flowed through them respectively. For example, one wiring line 24 supplies the supply potential, while the other wiring line 24 supplies the reference potential. Therefore, upon shorting of adjacent wiring lines 24, there occurs an inconvenience in the circuit of the microcomputer chip 3 and the SIP 1.

As shown in FIG. 30, in the case where any other wiring line 24 is disposed next to a wiring line 24 coupled electrically to the analog circuit section 23c, there will not occur shorting of plural wiring lines 24 through pads 21b even if the pads 21b are disposed in a zigzag fashion together with pads 21a. However, in a pad 21b-wiring line 24 overlapping region, the line width W1 of the wiring line 24 becomes large in comparison with the other region (it becomes larger than the line width W2 of a wiring line 24 in a pad layout direction of the region where outer pads 21a are formed). Thus, according to the design rule which defines an upper limit of the line width of a wiring line 24 coupled to a pad 21b, there may occur a case of exceeding the upper limit of the line width (a line width error).

On the main surface of the microcomputer chip 3, pads 21 and semiconductor elements, e.g., transistors and diodes, are coupled together electrically through wiring lines formed in plural wiring layers. Therefore, if only the above standpoint of avoiding the short-circuit of plural wiring lines 24 or line width error is taken into account, it may be possible to adopt a configuration such that pads 21 are disposed in the top surface wiring layer, wiring lines 24 coupled thereto are formed in a wiring layer underlying the wring layer of the pads 21, and dummy pads are arranged in a zigzag fashion. However, for the following reason, it is necessary that the wiring lines 24 coupled to the pads 21 be disposed in the same top surface wiring layer as that where the pads 21 are disposed.

Figure 11:
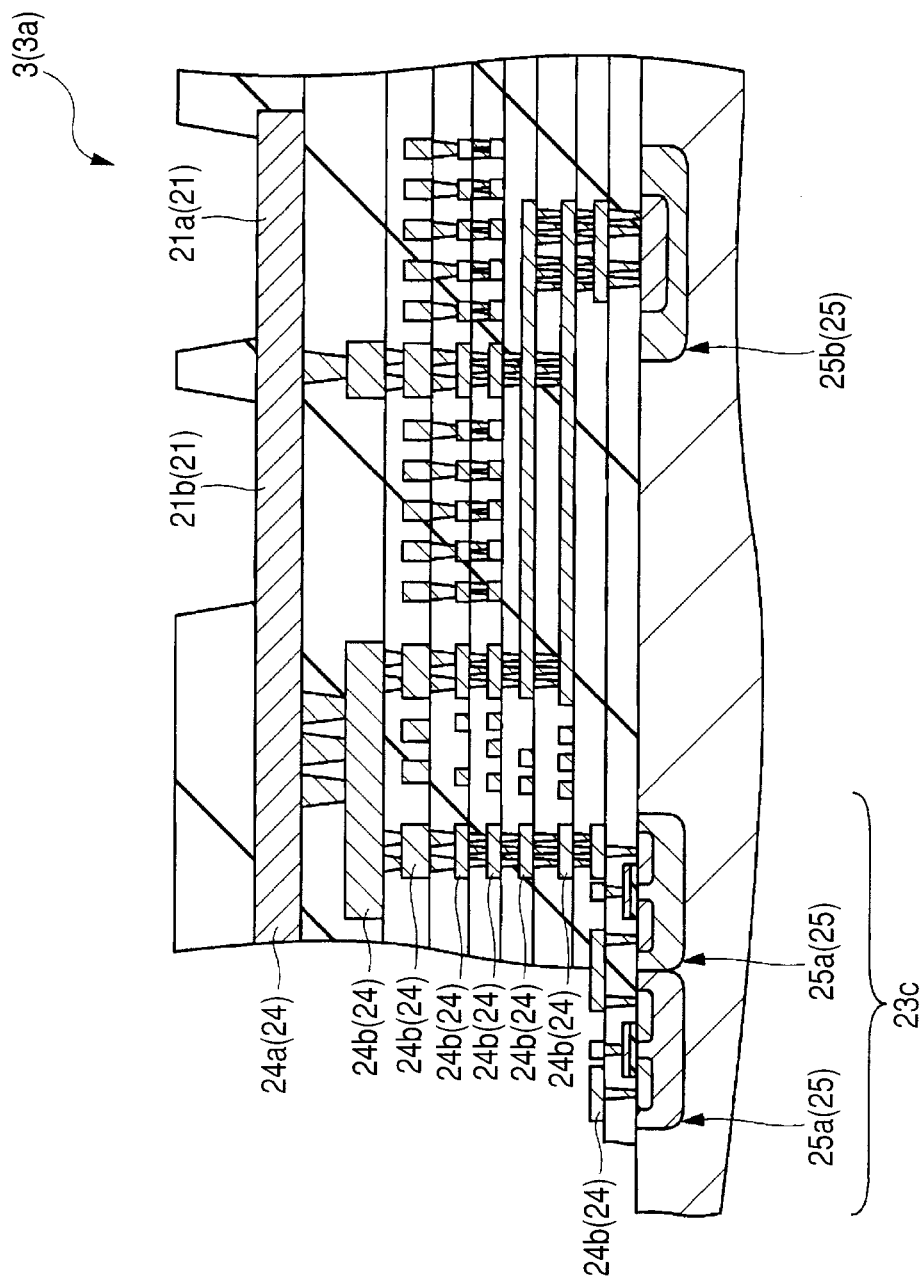
FIG. 11 is an enlarged sectional view of a principal portion, showing on a larger scale a section of wiring paths of wiring lines coupled to the analog circuit section shown in FIG. 10.

FIG. 11 is an enlarged sectional view of a principal portion, showing on a larger scale a section of wiring paths of the wiring lines coupled to the analog circuit section shown in FIG. 10. In FIG. 11 there is shown a detailed structure of the main surface of the microcomputer chip 3, but in this embodiment the main surface 3a indicates an area from the surface where semiconductor elements 25 are formed up to the insulating layer which covers the semiconductor elements 25-formed surface so as to expose the pads 21 formed on the top surface of the microcomputer chip 3. Therefore, the surface where wiring layers disposed over the semiconductor elements 25-formed surface are formed is included in the main surface 3a.

In FIG. 11, plural semiconductor elements 25 are formed on the main surface 3a of the microcomputer chip 3, and the semiconductor elements 25 and the pads 21 are coupled together through wiring lines 24 formed in plural wiring layers (eight layers in FIG. 11) which are stacked through insulating layers. In FIG. 11, as examples of semiconductor elements there are shown analog circuit elements 25a which are transistors and a protective diode 25b for protecting a core circuit from static electricity.

From the standpoint of diminishing the impedance component of the wiring paths coupled to the pads 21 and the analog circuit elements 25a it is preferable to thicken the wiring lines which shorten the wiring path length or make the line width large to effect coupling through a wiring line of the lowest sheet resistance. In this connection, it may be effective to form the analog circuit elements 25a at positions overlapping the pads 21 in the thickness direction to shorten the wiring path length. In this embodiment, however, as shown in FIG. 11, at positions overlapping the pads 21 in the thickness direction there are formed semiconductor elements 25 such as protective diodes 25b, while the analog circuit elements 25a as core circuits are formed in an area away from the pads 21 (the core circuit forming area 3e shown in FIG. 4).

The widths and thicknesses (line thicknesses) of wiring lines 24 formed in the wiring layers shown in FIG. 11 become smaller as the layer position becomes lower. That is, the wiring line 24a formed in the eighth wiring layer disposed on the top surface is large in sectional area and hence low in wiring resistance as compared with the wiring lines 24b formed in the underlying layers (first to seventh layers). Thus, for diminishing the resistance component in the wiring paths coupled to the analog circuit elements 25a it is necessary to draw out the wiring lines 24a of a low resistance as long as possible up to near the analog circuit elements 25a and shorten the wiring path length of the wiring lines 24b which are higher in resistance than the wiring lines 24a.

Figure 31:
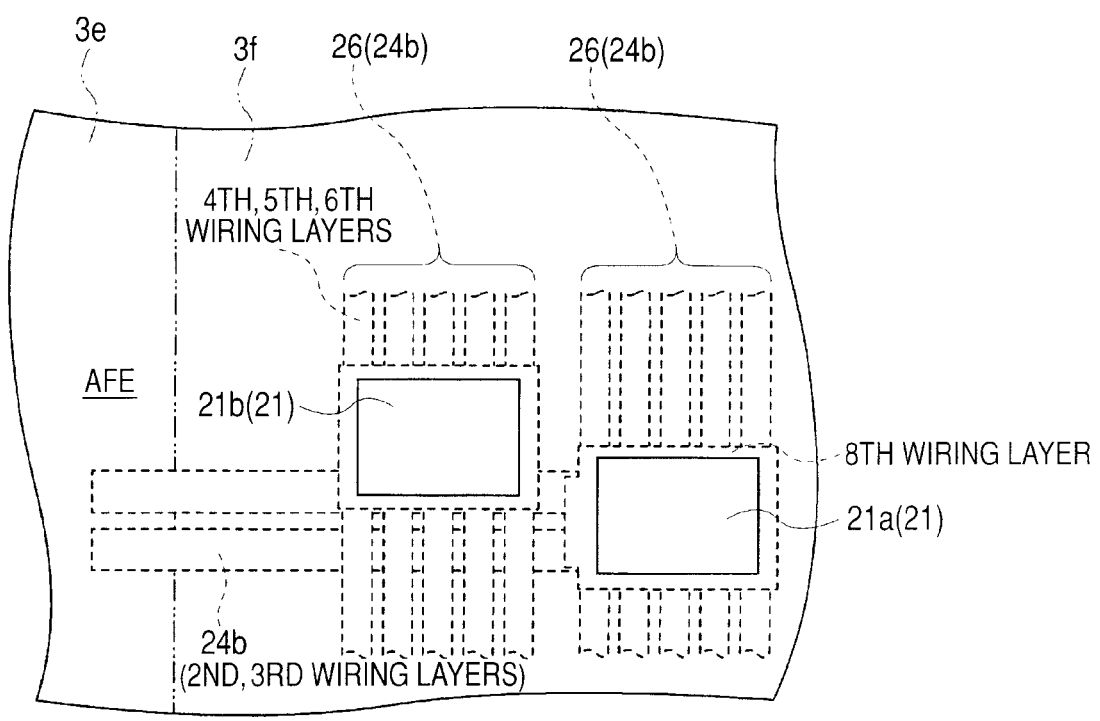
FIG. 31 is an enlarged plan view of a principal portion, showing on a larger scale a plane of wiring paths of wiring lines coupled to the analog circuit section as a still further comparative example in comparison with FIG. 10.
Figure 32:
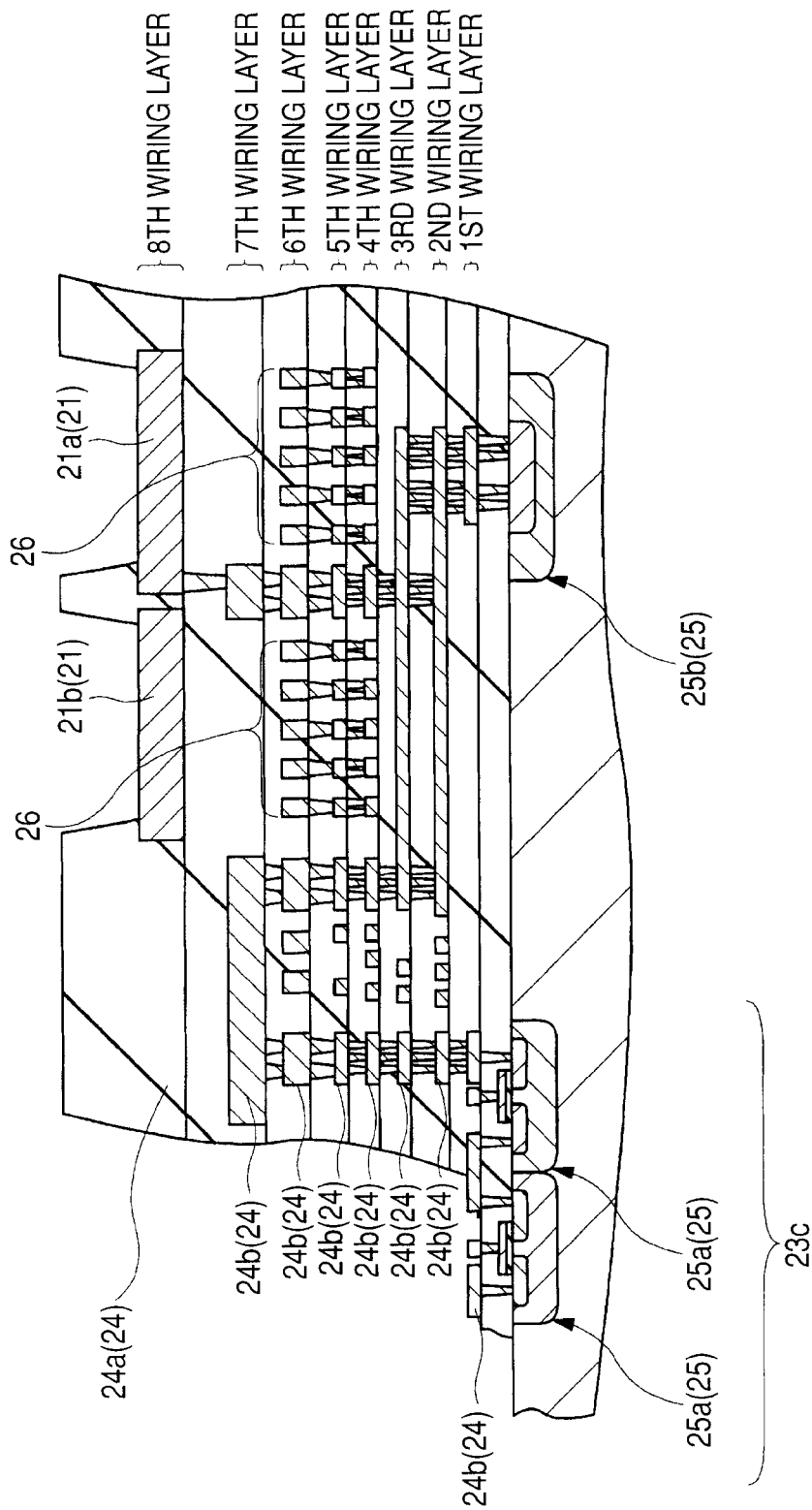
FIG. 32 is an enlarged sectional view of a principal portion, showing on a larger scale a section of wiring paths of wiring lines coupled to the analog circuit section as a still further comparative example in comparison with FIG. 10.

FIGS. 31 and 32 are respectively an enlarged plan view of a principal portion, showing on a larger scale wiring paths of wiring lines coupled to the analog circuit section, and an enlarged sectional view thereof. In this connection, as shown in FIG. 31, when outer periphery-side pads 21a and inner periphery-side pads 21b are arranged in a zigzag fashion, it is necessary, as shown in FIG. 32, to once lower the wiring path from the outer periphery-side pads 21a down to lower wiring layers (lower layer wiring lines) of second and third wiring layers, cross an I/O region (not shown), and bypass peripheral power supply wiring lines 26 each comprised of wiring lines 24b in fourth, fifth and sixth wiring layers. The wiring layer for an analog power supply in the analog circuit section is the second lowest in sheet resistance next to the wiring layer (eighth wiring layer in this embodiment) positioned on the top layer side and is comprised of the underlying wiring layer (seventh wiring layer in this embodiment). For coupling to this wiring layer (seventh wiring layer) the wiring must be further pulled up from an underlying wiring layer (third wiring layer in this embodiment) to the wiring layer (seventh wiring layer). Then, for the supply of electric power from an analog power source in this wiring layer (seventh wiring layer) to analog circuit elements, the wiring is again pulled down from this wiring layer (seventh wiring layer) to the underlying layer and is coupled to the diffusion layer in transistors formed in the interior of AFE, thus resulting in increase of the impedance component. The reason why the wiring layer (seventh wiring layer) coupled to the pad 21a comprised of a part of the top wiring layer (eighth wiring layer) is not positioned just under the pad (dummy pad) 21b is that if a wiring layer (seventh wiring layer) is present just under the pad 21b, there is a fear of the interlayer film between the pad 21b and the wiring layer (seventh wiring layer) being stripped, with consequent deterioration of reliability, due to stress induced after bump coupling.

In this embodiment, therefore, as to the wiring lines 24 coupled to analog circuit elements 25a for which a decrease of the resistance component (impedance component) of wiring paths is required, the wiring path length of the wiring lines disposed on the top surface is longer than that of the other wiring lines 24b. That is, the top surface wiring layer as a wiring layer for forming pads 21 is made the longest in line length and largest in line width. Consequently, as noted earlier, in the case where pads 21b and 21a are arranged in a zigzag fashion with central positions of opposed sides being deviated from each other, as shown in FIGS. 29 and 30, there occurs a short-circuit or a line width error with respect to the wiring lines 24.

Although in FIG. 10 there is shown an example in which each wiring line 24a is formed by a single wiring line, if the line width is extremely narrower than the width of each pad 21 due to design rule restrictions, there may be adopted a configuration wherein plural wiring lines 24a are coupled to a single pad 21. By adopting such a configuration it is possible to decrease the resistance value of the wiring line 24a while setting the line width of each wiring line to a value falling under an allowable range according to the design rule.

Having made a study about the layout of pads 21 in view of the above results, the present inventors found out a technique for diminishing variations in temperature of each bonding portion in flip-chip mounting while preventing short-circuit of adjacent wiring lines 24a. That is, as shown in FIG. 10, in wiring paths coupled to the analog circuit section 23c, the pads 21b and 21a are arranged so that their opposed sides are aligned with each other. In other words, in each of the wiring paths coupled electrically to the analog circuit section 23c, a plurality of mutually insulated, dedicated pads 21 are disposed. It follows that the analog circuit elements 25a are each coupled to plural pads 21 electrically.

By aligning opposed sides of the pads 21b and 21a with each other it is meant that an extension line joining the centers of opposed sides passes through the centers of the pads 21b and 21a. However, the degree of the alignment suffices if adjacent wiring lines 24 do not short through pads 21b. Therefore, for example even when an extension line joining the centers of opposed sides deviates slightly from the centers of the pads 21b and 21a, it suffices if the pad 21b does not straddle plural wiring lines 24 and if it has a thickness not causing a line width error.

On the other hand, in this embodiment, as to pads 21 relatively small in the degree of being influenced by an increase of the impedance component as compared with the pads 21 coupled to the analog circuit section 23c, they are arranged in a zigzag fashion so that the center of each pad 21a disposed on the outer periphery side is positioned on an extension line between two pads 21b adjacent to each other on the inner periphery side. For example, the pads 21 coupled to the control circuit section 23a shown in FIG. 4 and adapted to input and output a digital signal current correspond to the pads 21 relatively small in the degree of being influenced by an increase of the impedance component as compared with the pads 21 coupled to the analog circuit section 23c.

Thus, in case of disposing pads 21 in plural rows, if the zigzag layout region and the aligned region of opposed sides of pads 21a and 21b are made present in a mixed manner, the distance (layout pitch) between adjacent pads 21 becomes slightly different region by region, so that a slight difference occurs with respect to the foregoing heat retaining effect. However, in comparison with the case where no pad 21 is disposed on the inner periphery side of the pads 21a to prevent shorting of the wiring lines 24, it is possible to greatly remedy the variations in temperature between the bonding portions of adjacent pads 21. Consequently, it is possible to prevent or suppress a bonding defect caused by variations in temperature between the bonding portions.

Moreover, by mixing the zigzag layout region with the aligned region of opposed sides of pads 21a, 21b, the number of terminals can be increased in the zigzag layout region. Consequently, it is possible to suppress an increase of external dimensions while suppressing the occurrence of a bonding defect in the semiconductor device.

In this embodiment reference has been made as an example to the wiring paths coupled to the analog circuit section 23c as wiring paths wherein a plurality of adjacent wiring lines 24 are likely to short if pads 21a and 21b are arranged in a zigzag fashion. However, this description is applicable also to any other wiring paths wherein a plurality of adjacent wiring lines 24 are likely to short in case of pads 21a and 21b being arranged in a zigzag fashion.

<Application to Semiconductor Chip with Pads arranged in Plural Rows on Main Surface-2>

Next, reference will be made below to an example in which if pads 21a and 21b are merely arranged regularly in two rows, short-circuit of adjacent wiring lines results, which is attributable to the wiring layout on the upper surface 2a of the wiring substrate 2.

Figure 12:
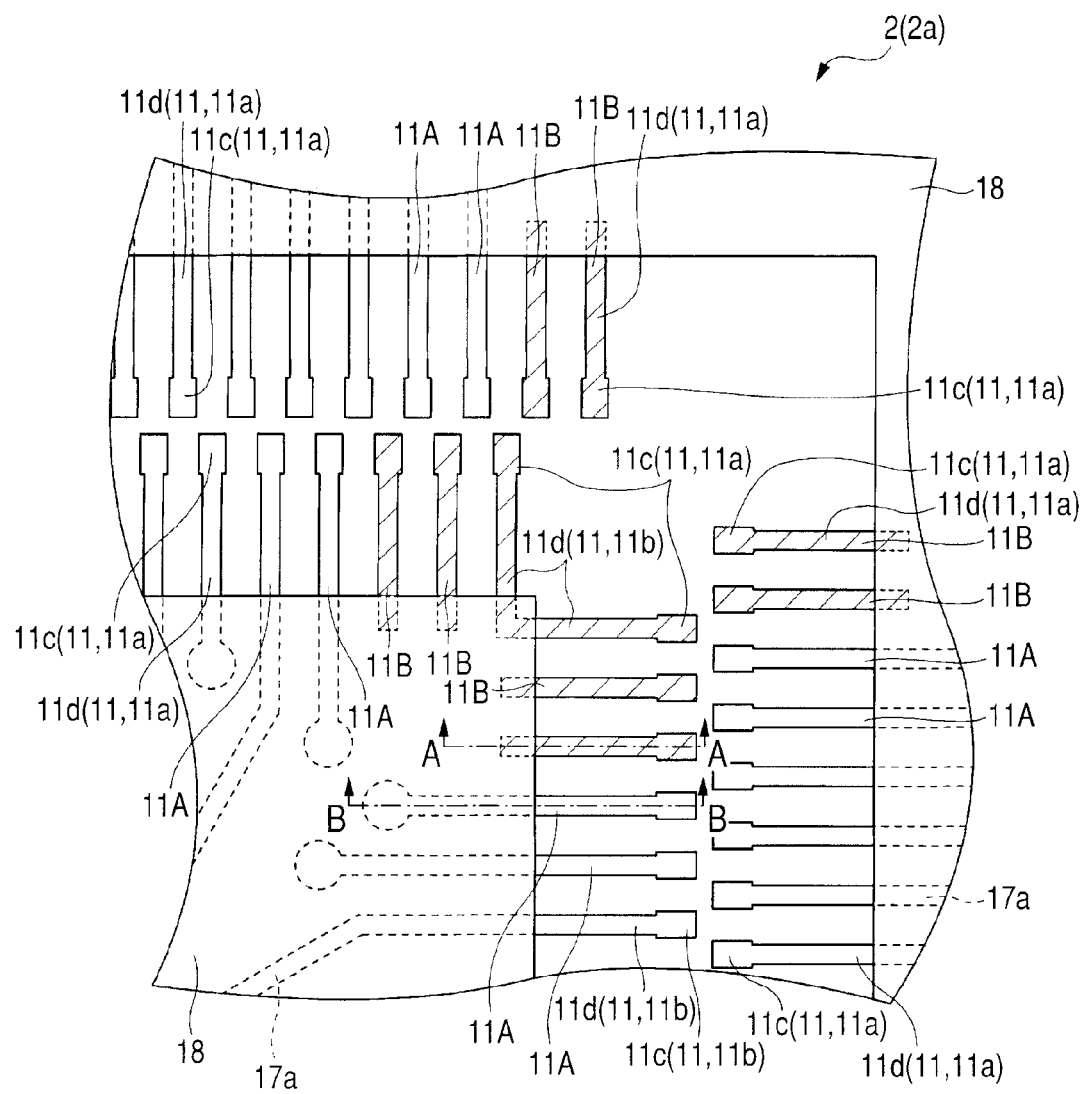
FIG. 12 is an enlarged sectional view of a principal portion, showing on a larger scale a corner and the vicinity thereof of a chip mounting area on the wiring substrate shown in FIG. 2.
Figure 13:
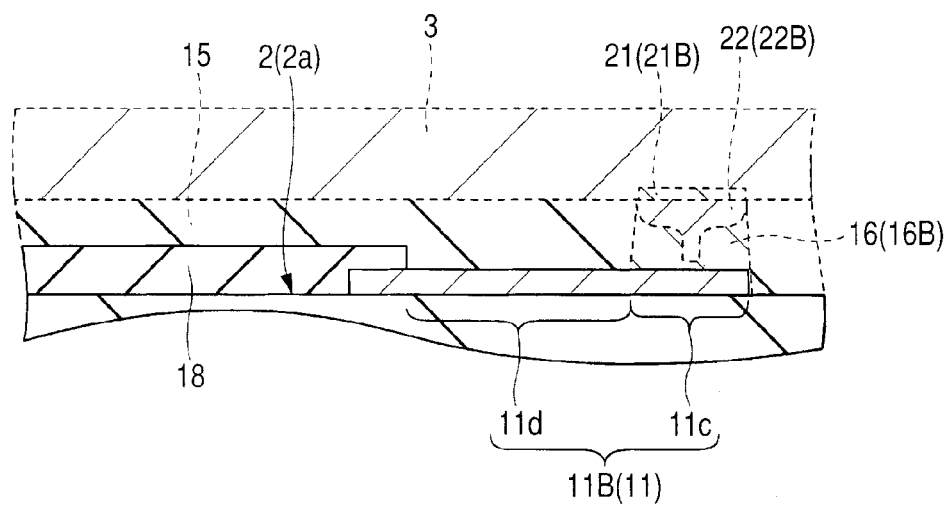
FIG. 13 is an enlarged sectional view of a principal portion taken along line A-A in FIG. 12.
Figure 14:
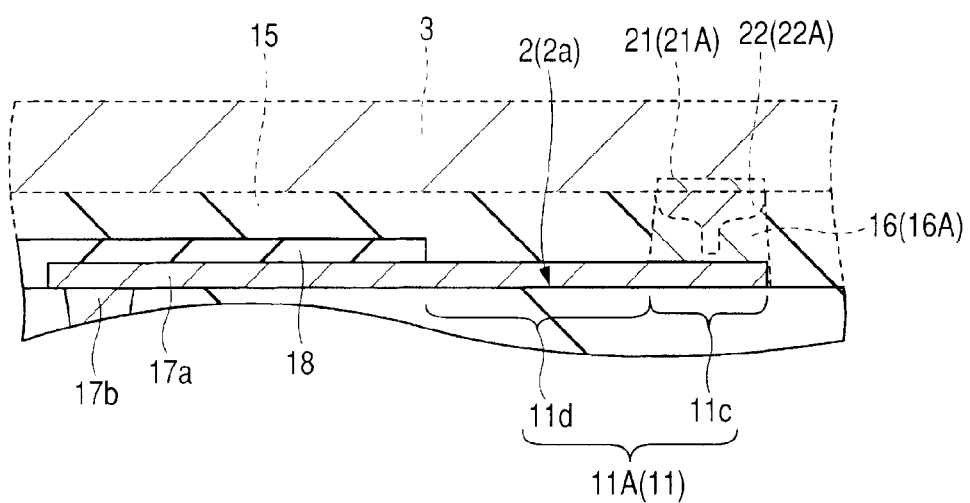
FIG. 14 is an enlarged sectional view of a principal portion taken along line B-B in FIG. 12.

FIG. 12 is an enlarged sectional view of a principal portion, showing on a larger scale the environs of a corner of the chip mounting area on the wiring substrate shown in FIG. 2, FIG. 13 is an enlarged sectional view of a principal portion taken along line A-A in FIG. 12, and FIG. 14 is an enlarged sectional view of a principal portion taken along line B-B in FIG. 12.

In FIGS. 12 to 14, terminals 11 formed on the upper surface 2a of the wiring substrate 2 each comprise a boding portion 11c disposed at the position opposed to a corresponding pad 21 on the microcomputer chip 3 and a lead-out line 11d extending in a direction intersecting (substantially perpendicularly) the layout direction of plural terminals 11 from the bonding portion 11c. More particularly, lead-out lines 11d of terminals 11b arranged in inner rows extend inwards of the chip mounting area 2c, while lead-out lines 11d of terminals 11a arranged in outer rows extend outwards of the chip mounting area 2c, from the respective bonding portions 11c.

The upper surface 2a of the wiring substrate 2 is coated with an insulating film 18 formed of resin called solder resin for example. An opening of the insulating film 18 is formed around the bonding portions 11c and a portion of the bonding portions 11c and lead-out lines 11d are exposed from the insulating film 18. In FIG. 12, the insulating film 18 is not formed in the region between outer terminals 11a and inner terminals 11b or in the region between adjacent terminals 11, which regions are exposed. This is because when the layout pitch of terminals 11 is made narrow to afford a multi-pin structure like the wiring substrate 2 used in this embodiment, the inconvenience that the bonding portions 11c are covered with the insulating film 18 is to be prevented in relation to the positional accuracy at the time of forming the insulating film 18. It follows that in the case where the layout pitch of terminals 11 is sufficiently wide and the insulating film 18 can surely be formed between adjacent terminals 11, an opening of the insulating film 18 may be formed along the external form of the terminals 11, allowing the terminals to be exposed. The bonding portions 11c and lead-out lines 11d shown in FIGS. 12 to 14 configure a portion of the wiring lines 17a formed on the upper surface 2a of the wiring substrate 2 shown in FIG. 9. In this embodiment, however, a description will be given below on the assumption that the portions exposed from the insulating film 18 are the lead-out lines 11d or the bonding portions 11c.

In this embodiment there are formed a plurality of lead-out lines 11d extending in a direction intersecting (substantially perpendicularly) the layout direction of plural terminals 11 from the bonding portions 11d, and the lead-out lines 11d are exposed from the insulating film 18. This is for the following reason.

According to this embodiment, in the step (flip-chip mounting step, die bonding step) of mounting the microcomputer chip 3 onto the wiring substrate 2, a soldering material is disposed (applied) onto the bonding portions 11c and lead-out lines 11d beforehand prior to mounting the microcomputer chip 3, and in this state the wiring substrate 2 is heated. If for example the bumps 22 come partially into contact with a part of the melted soldering material, the solder material becomes easier to gather toward the bumps 22. In the flip-chip mounting step, therefore, the soldering material disposed on the lead-out lines 11d also gathers in the direction of the bumps 22.

As shown in FIG. 12, if the width of each bonding portion 11c is formed larger than the width of each lead-out line 11d, the melted soldering material exhibits a property of gathering to a wide region. Consequently, the soldering material disposed on the bonding portions 11c and lead-out lines 11d gathers to the bonding portions 11c formed at a larger width than the lead-out lines 11d, whereby solder 16 is formed.

By thus configuring each terminal 11 with both bonding portion 11c and lead-out line 11d and disposing the soldering material on both bonding portion 11c and lead-out line 11d, both bump 22 and solder 16 can be bonded together in a positive manner while preventing short-circuit of adjacent terminals 11. That is, by disposing the soldering material on both bonding portion 11c and lead-out line 11d, the soldering material can be disposed long and slenderly, thus making it possible to prevent short-circuit between adjacent terminals 11. Moreover, as a result of melting of the soldering material disposed on each lead-out line 11d and gathering of the melted soldering material to the associated bonding portion 11c, the soldering material disposed on the lead-out line 11d also becomes solder 16. Consequently, the amount of the solder 16 becomes larger than in case of disposing the soldering material on only the bonding portion 11c, so that the bondability between the bump 22 and the solder 16 can be improved. Thus, since the soldering material is disposed also on the lead-out lines 11d, the lead-out lines 11d are partially exposed from the insulating film 18. From the standpoint of making the soldering material easy to gather at the bonding portions 11c, it is preferable that the terminals 11 be extended in the direction orthogonal to the layout direction of the terminals 11. Further, from the standpoint of increasing the amount of the soldering material, it is also preferable to make the line extending distance long.

However, as shown in FIG. 4, in case of arranging pads 21 along the constituent sides of the outer edges of the main surface 3a of the microcomputer chip 3, arrays of pads 21 cross each other in the vicinity of a corner of the main surface 3a. As a result, as shown in FIG. 12, arrays of terminals 11 arranged at positions opposed to the pads 21 (see FIG. 13) also cross each other in the vicinity of a corner of the chip mounting area. In this case, out of the lead-out lines 11d extending inwards of the chip mounting area, the lead-out lines 11d disposed around a corner are likely to cause a short-circuit between those extending in the crossing directions.

To prevent such a short-circuit of lead-out lines 11d, especially those arranged insides, the terminals 11b arranged insides are generally not formed in the vicinity of a corner of the chip mounting area. However, when the region where terminals 11 are arranged in one row and the region where terminals 11 are arranged in two rows are both present mixedly in the layout of terminals 11, there occur temperature variations around the bump 22-solder 16 bonding portions in the flip-chip mounting step, as noted earlier, which temperature variations cause the occurrence of a bonding defect. On the other hand, if the number of terminals 11b arranged in the outer row is decreased to suppress such temperature variations, the number of terminals capable of being arranged decreases, with the result that it may no longer be possible to ensure the required number of terminals.

To avoid such an inconvenience, in this embodiment, dummy terminals 11B are arranged at an end of each array of terminals 11 arranged in plural rows. That is, dummy terminals 11B are arranged at an array end of terminals 11a arranged in the outer row and also at an array end of terminals 11b arranged in the inner row. As noted above, pads 21B of the microcomputer chip 3 are arranged at positions opposed to the terminals 11B and the terminals 11B are thermally coupled to the pads 21B through bumps 22B and solder 16B. Thus, in each array of terminals 11, a terminal 11A or 11B is disposed next to a terminal 11A in which a unique electric current flows, and since pads 21 are coupled to the terminals 11A and 11B through bumps 22 and solder 16, the environs of the bonded portions function as heat retaining walls, whereby temperature variations can be suppressed.

If the terminals 11B are used as dummy terminals not electrically coupled to various core circuits of the microcomputer chip or to external devices (in this case the pads 21B, bumps 22B and solder 16B also become dummies not electrically coupled to external devices). For example as shown in FIG. 12, even when the lead-out lines 11d of terminals 11B are in contact with the lead-out lines 11d of other terminals 11B, this does not cause a lowering of reliability. Therefore, the terminals 11b disposed in the inner row can be disposed up to each corner of the chip mounting area. Thus, on the upper surface 2a of the wiring substrate 2, even when terminals 11 are arranged along each side of the chip mounting area having a quadrangular external shape, inner sides of a first row of terminals 11a arranged on the outer periphery side and outer sides of a second row of terminals 11b arranged inside the terminals 11a can be opposed to each other planarly.

In FIG. 12, since dummy terminals 11B are disposed at each array end of the outer terminals 11a, terminals 11b are not disposed at inside positions planarly opposed to the terminals 11B positioned at each array end of terminals 11a. That is, the terminals 11B positioned at an array end are arranged in one row. In the case where the terminals 11B are made dummy, there is not made a requirement for attaining reliability of electrical coupling with pads 21B, but it suffices if there is a thermal coupling between the two. Thus, it is intended to decrease the number of terminals 11b disposed inside and thereby decrease the amount of the material used. However, terminals 11B may be disposed inside and at positions planarly opposed to the terminals 11B positioned at each array end of the terminals 11a. In this case, it is possible to suppress a temperature drop around the bonding portions of dummy terminals 11B positioned at an array end, so that the wettability of the solder 16 bonded to each of the terminals 11B is improved, resulting in the heat retaining effect being further improved.

Although in connection with FIG. 12 a description has been given above assuming that the terminals 11B are dummy terminals not electrically coupled to external devices, the terminals 11B are not limited to dummy terminals, but if they are terminals in which an electric current common to other terminals 11 is flowed, they are also employable for example as terminals for the supply of a supply potential or a reference potential. Particularly, as to the terminals 11a disposed on the outer periphery side, since the lead-out lines 11d extend outwards, there is little fear of short-circuit between lead-out lines 11d even when they are disposed at a corner. Thus, as to the terminals 11a disposed on the outer periphery side, the number of terminals can be increased by electrically coupling the terminals 11B disposed at an array end to the lands 13 shown in FIG. 1 and by using them as terminals in which an electric current common to other terminals 11 is flowed.

As to the terminals 11b disposed inside the terminals 11a, as shown in FIG. 12, in the event of contact therewith of lead-out lines 11d of terminals 11B, a common electric current is flowed through the contacting lead-out lines 11d, whereby the deterioration of reliability caused by short-circuit can be prevented. In this case, however, there occur restrictions on the layout of terminals 11 and wiring lines coupled thereto as described above, so from the standpoint of improving the design freedom, it is preferable that in the inner row the terminals 11B be used as dummy terminals not electrically coupled to external devices. On the other hand, in the outer row, restrictions on the layout of terminals 11 and wring lines are difficult to occur in comparison with the inner row, therefore, as to the outer row, the terminals 11B are used as terminals in which an electric current common to other terminals 11B flows, whereby it is possible to reduce the resistance of the conduction path of the electric current in question.

In case of using the terminals 11B as dummy terminals, as shown in FIG. 12, the lead-out lines 11d of the terminals 11B are mutually coupled. In addition, the length of each of the lead-out lines 11d coupled to the terminals 11B may be made shorter than each of the lead-out lines 11d of terminals 11 (e.g., terminals 11A) which are coupled electrically to external devices through lands 13 (see FIG. 1). In this case, the amount of soldering material disposed on each lead-out line 11d becomes smaller than that of soldering material disposed on each of the lead-out lines 11d of the terminals 11A, so that the amount of the soldering material which configures the solder 16B shown in FIG. 7 becomes smaller. However, from the standpoint of using the terminals 11B as heat retaining terminals, it suffices if it is possible to ensure such a degree of solder quantity as permits thermal coupling between each terminal 11B and the pad 21 disposed in opposition thereto. Therefore, even when the amount of solder 16B is smaller than that of solder 16A disposed on each terminal 11A, as shown in FIG. 7, it is possible to obtain a heat retaining effect if the solder 16B and a part of the ball portion 22a of each bump 22B are in contact with each other. Moreover, as noted above, the solder 16 is formed by gathering of the soldering material to the bonding portion 11c which soldering material is disposed on each lead-out line 11d. Therefore, if mutual contact of the lead-out lines 11d can be prevented by shortening each lead-out line 11d, a moving direction of melted soldering material can be defined in one direction, so that the solder 16B formed in each bonding portion 11c can be brought into contact with the associated bump 22B positively.

<Semiconductor Device Manufacturing Method>

Figure 15:
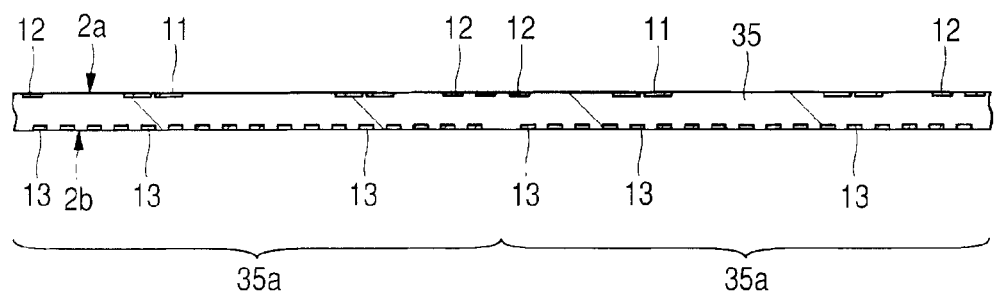
FIG. 15 is an enlarged sectional view of a principal portion, showing on a larger scale a part of a wiring substrate provided in a wiring substrate preparing step in a method for manufacturing the semiconductor device according to the embodiment.

A description will now be given about a method for manufacturing the SIP 1 shown in FIG. 1. In the method for manufacturing the SIP 1 according to this embodiment, first a wiring substrate is provided. FIG. 15 is an enlarged sectional view of a principal portion, showing on a larger scale a part of a wiring substrate provided in a wiring substrate providing step according to this embodiment.

In this step, a matrix substrate (a multi-device wiring substrate) 35 shown in FIG. 15 is provided. The matrix substrate 35 is a wiring substrate on which a plurality of product forming areas 35a are arranged for example in a matrix shape, each of the product forming areas 35a corresponding to the wiring substrate 2 shown in FIG. 1. The terminals 11, 13 and lands 13 shown in FIG. 1, as well as wiring lines for electrical coupling between terminals, are formed beforehand in each product forming area.

Figure 16:
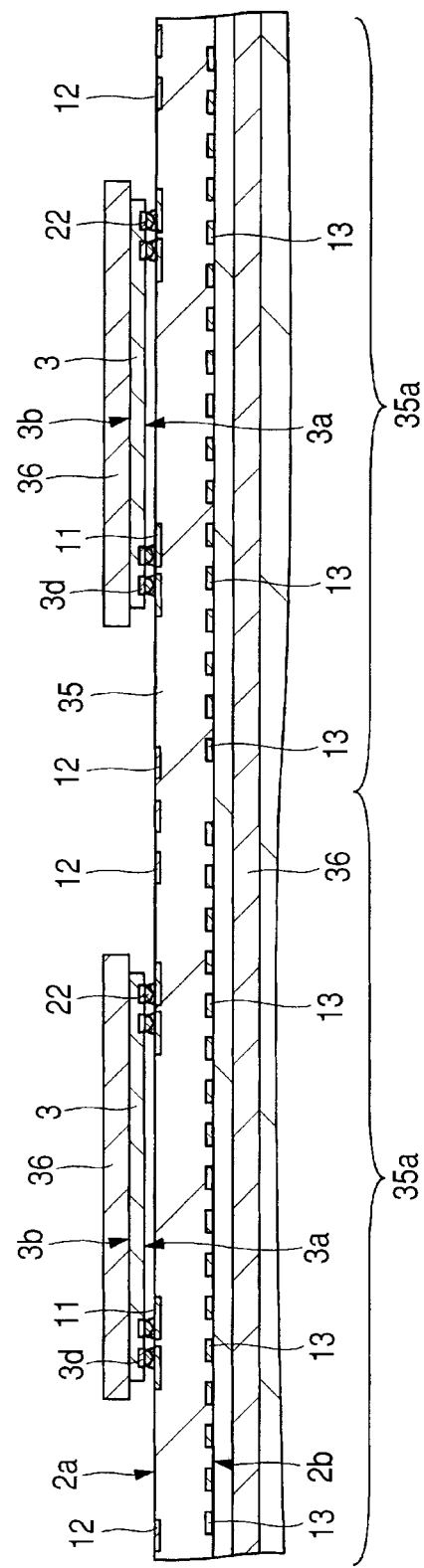
FIG. 16 is an enlarged sectional view of a principal portion, showing a step of mounting a microcomputer chip onto an upper surface of the wiring substrate shown in FIG. 15.

Next, microcomputer chips 3 (see FIG. 1) are mounted on an upper surface 2a of the matrix substrate 35 (flip-chip mounting step, die bonding step). FIG. 16 is an enlarged sectional view of a principal portion, showing a step of mounting microcomputer chips on the upper surface of the wiring substrate shown in FIG. 15.

In this step, pads 21 formed on a main surface 3a of each microcomputer chip 3 and terminals 11 formed on the upper surface 2a of the matrix substrate 35 are coupled together through bumps 22 in a state in which the main surface 3a of the microcomputer chip 3 is opposed to the upper surface 2a of the matrix substrate 35. Thus, the pads 21 and the terminals 11 are coupled together electrically by face-down mounting. The bonding method using bumps 22 will be described in detail for example as follows.

A solder material is disposed (applied) onto the surface (bonding portion 11c and lead-out line 11d) of each terminal 11 on the matrix substrate 35. This step may be carried out just before mounting the microcomputer chips 3, but a wiring substrate with the soldering material pre-applied to terminals 11 may be provided.

Next, microcomputer chips 3 with bumps 22 formed on the pads 21 respectively of the main surfaces 3a are provided and are mounted while aligning the bumps 22 with the terminals 11 so that the main surfaces 3a and the upper surface 2a of the matrix substrate 35 confront each other. Heat sources 36 such as heaters are disposed on back surfaces 3b of the microcomputer chips 3 and on a lower surface 2b of the matrix substrate 35 to heat the microcomputer chips 3 and the matrix substrate 35. With this heat, the soldering material disposed on each terminal 11 melts, then wets and rises to the associated bump 22 to form a gold-solder bond.

In this step, for suppressing the occurrence of a bonding defect, it is necessary to diminish temperature variations around the bonded portion of each bump 22 because plural bumps 22 and terminals 11 are bonded at a time. According to this embodiment, next to the unique current flowing bumps 22A there are disposed dummy bumps 22B in which there flows an electric current common to other bumps 22 or which are not electrically coupled to external devices, then the dummy bumps 22B are bonded to terminals 11 on the matrix substrate 35, thereby making it possible to diminish temperature variations around the bonded portion of each bump 22.

Figure 17:
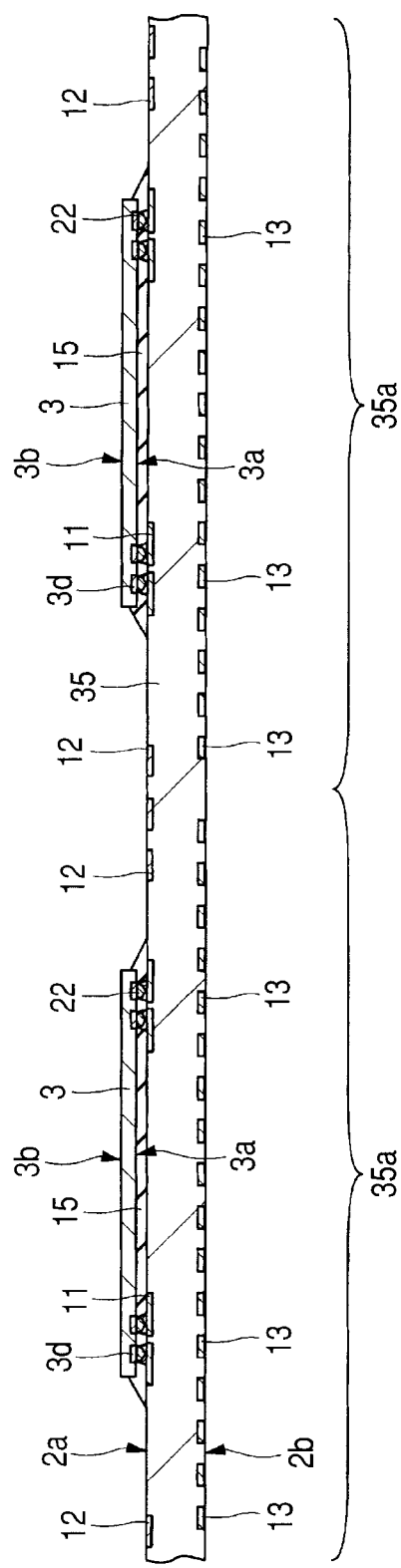
FIG. 17 is an enlarged sectional view of a principal portion, showing a state in which underfill resin is disposed between the microcomputer chip shown in FIG. 15 and a matrix substrate.

Next, underfill resin 15 is disposed between the main surfaces 3a of the microcomputer chips 3 and the upper surface 2a of the matrix substrate 35 to seal the main surfaces 3a of the microcomputer chips 3 with resin. FIG. 17 is an enlarged sectional view of a principal portion, showing a state in which the underfill resin is disposed between the microcomputer chips and the matrix substrate both shown in FIG. 15. In this step, the underfill resin 15 is supplied (filled) to between the main surfaces 3a of the microcomputer chips 3 and the upper surface 2a of the matrix substrate 35 while applying heat continuously in the foregoing gold-solder bonding step. Thereafter, the underfill resin is heat-cured to protect the bonded portions between the bumps 22 and the terminals 11.

Figure 18:
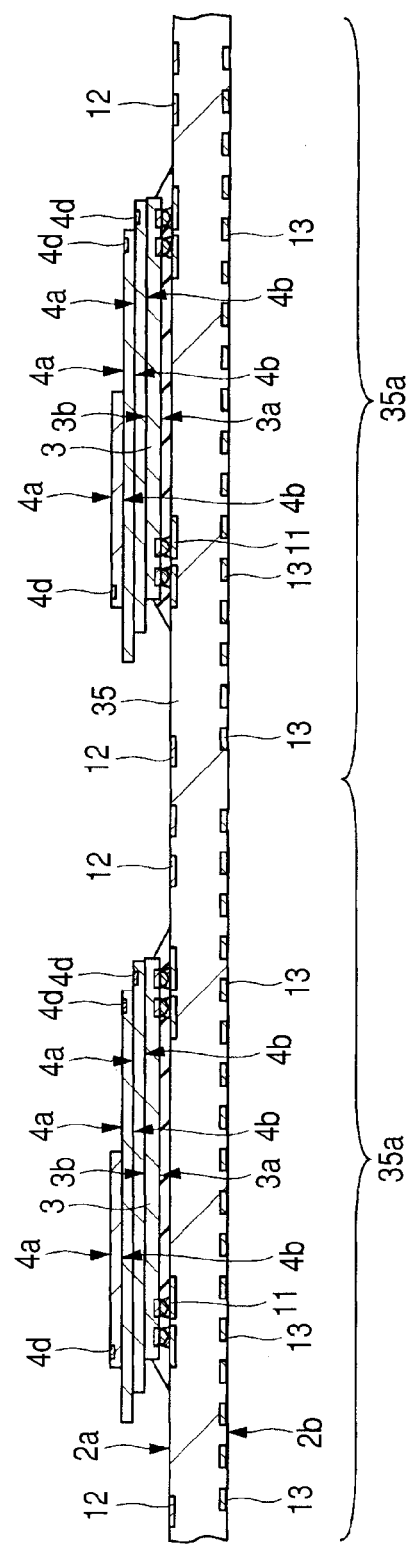
FIG. 18 is an enlarged sectional view of a principal portion, showing a state in which memory chips are mounted on a back surface side of the microcomputer chip shown in FIG. 17.

Then, memory chips 4 are mounted. FIG. 18 is an enlarged sectional view of a principal portion, showing a state in which memory chips were mounted on the back surface side of each microcomputer chip 3 shown in FIG. 17. In this step, a back surface 4b of each memory chip 4 is fixed in such a state as confronts a back surface 3b of the associated microcomputer chip 3. Thus, the memory chips are mounted by so-called face-up mounting. Since the number of terminals (the number of pads) of each memory chip 4 is small in comparison with the number of terminals of each microcomputer chip 3, the manufacturing cost can be reduced by face-up mounting.

In this embodiment, since plural memory chips 4 are mounted, the memory chips 4 are stacked and fixed in order. A memory chip 4 to be stacked in an upper layer is fixed onto an underlying memory chip 4 in a state in which its back surface 4b is opposed to a main surface 4a of the underlying memory chip 4. The stacking is performed so as to expose pads 4d of the underlying memory chip 4.

Each memory chip 4 is fixed through a bonding material onto the back surface 3b of the associated microcomputer chip 3 or onto the main surface 4a of the underlying memory chip 4. As the bonding material there may be used paste resin or an adhesive tape called DAF (Die Attach Film).

Figure 19:
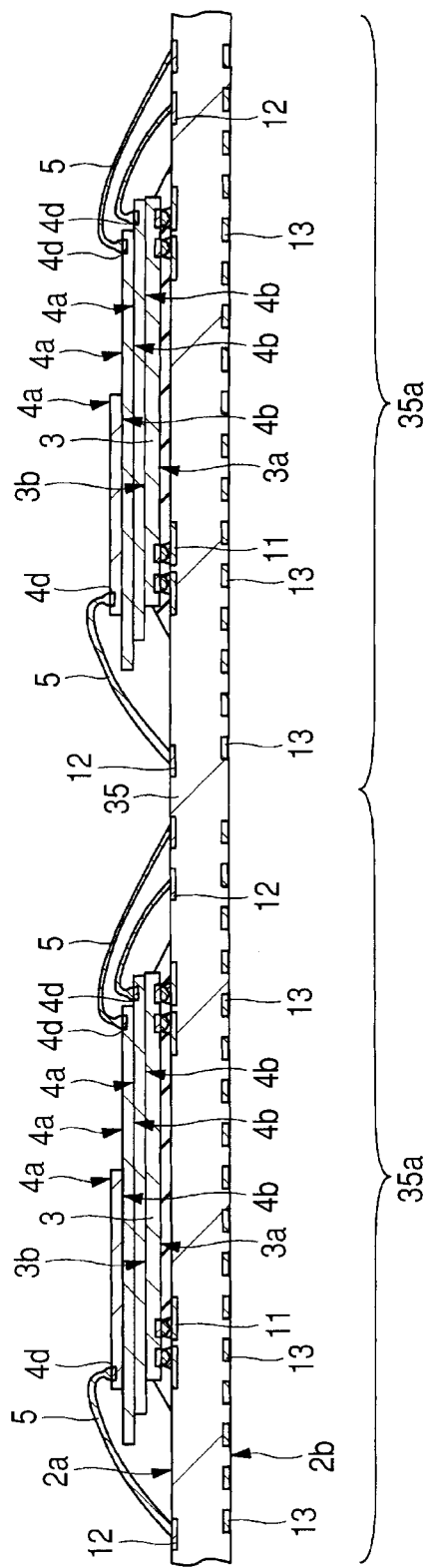
FIG. 19 is an enlarged sectional view of a principal portion, showing a state in which pads of the memory chips shown in FIG. 18 and terminals of the wiring substrate are coupled electrically with each other.

Next, in a wire bonding step, the pads 4d and terminals 12 of each memory chip 4 are coupled electrically through wires 5. FIG. 19 is an enlarged sectional view of a principal portion, showing a state in which the pads of each memory chip shown in FIG. 18 and the terminals of the wiring substrate were coupled together electrically. In this step, the coupling begins with the pads 4d of the memory chip 4 in a lower layer to prevent shorting between wires 5.

Figure 20:
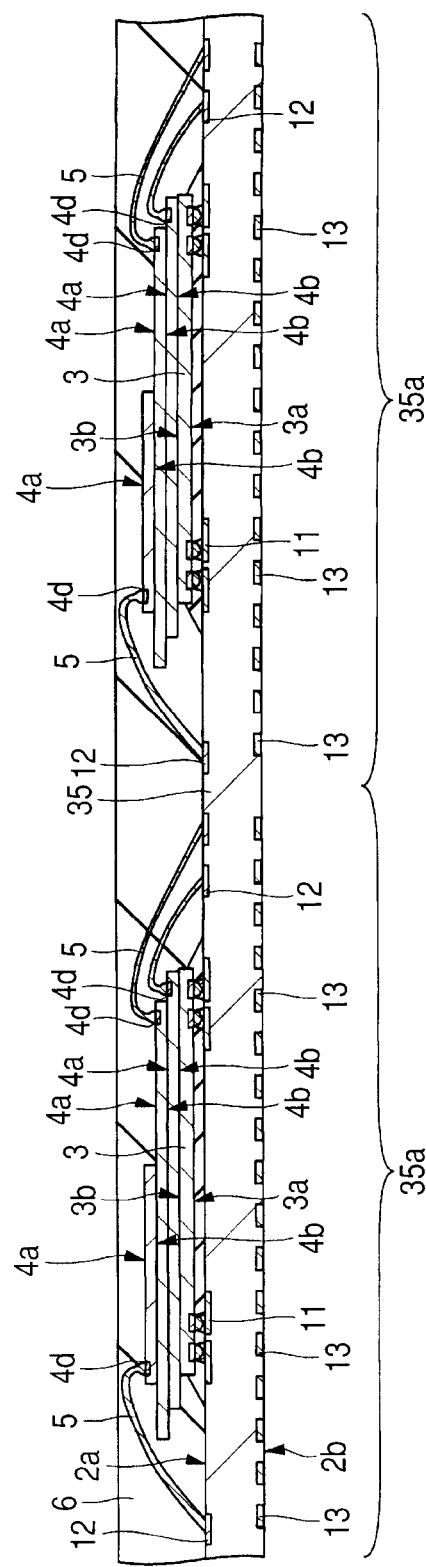
FIG. 20 is an enlarged sectional view of a principal portion, showing a state in which the memory chips shown in FIG. 19 and wires are sealed by a sealing body.

Then, in a resin sealing step, the memory chips 4 and the wires 5 are sealed (resin-sealed) with a sealing body 6. FIG. 20 is an enlarged sectional view of a principal portion, showing a state in which the memory chips and wires shown in FIG. 19 were sealed with the sealing body. In this step, for example, a plurality of product forming areas are sealed all together (in a covered state of plural product forming areas with one cavity of a molding die). That is, the sealing body 6 is formed by a so-called block molding method (a block transfer molding method).

Figure 21:
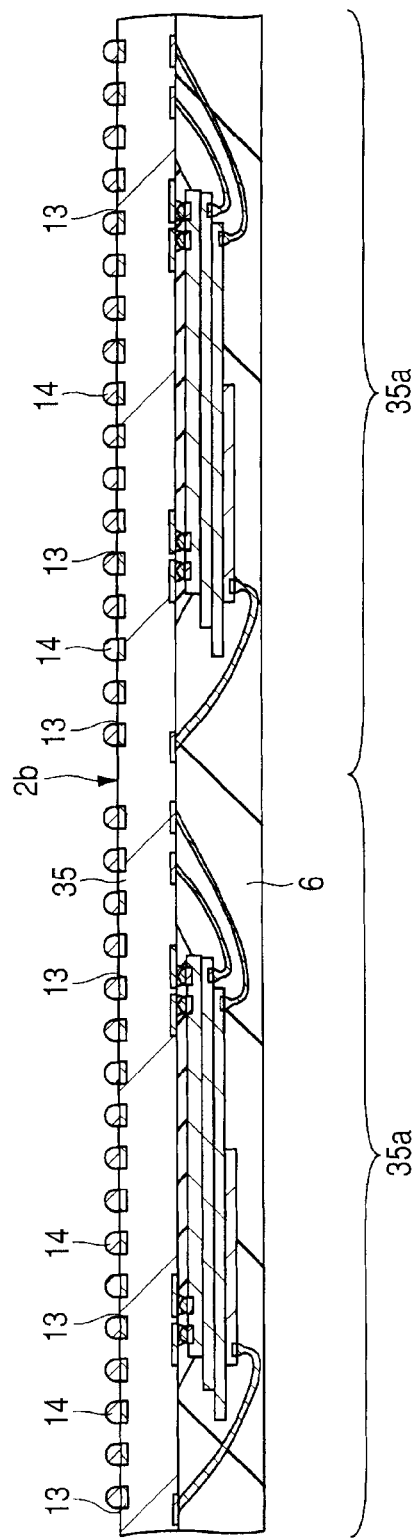
FIG. 21 is an enlarged sectional view of a principal portion, showing a step of mounting solder balls onto a lower surface side of the wiring substrate shown in FIG. 20.

Next, balls 14 are mounted on the lower surface 2*b* of the matrix substrate 35. FIG. 21 is an enlarged sectional view of a principal portion, showing a step of mounting solder balls on the lower surface side of the wiring substrate shown in FIG. 20.

In this step, as shown in FIG. 21, with the upper surface of the sealing body 16 facing down, the solder balls 14 are mounted respectively on the surfaces of lands 13 formed on the lower surface 2*b* of the matrix substrate 35.

Next, the matrix substrate 35 thus formed with the sealing body 16 is cut (diced) product forming area by product forming area to afford the SIP 1 shown in FIG. 1. Then, the SIP 1 is subjected to electrical inspection or visual inspection where required, and whether it is good or not is determined to complete the SIP 1.

Although the present invention has been described above concretely by way of an embodiment thereof, it goes without saying that the present invention is not limited to the above embodiments and that various changes may be made within the scope not departing from the gist of the invention.

Figure 22:
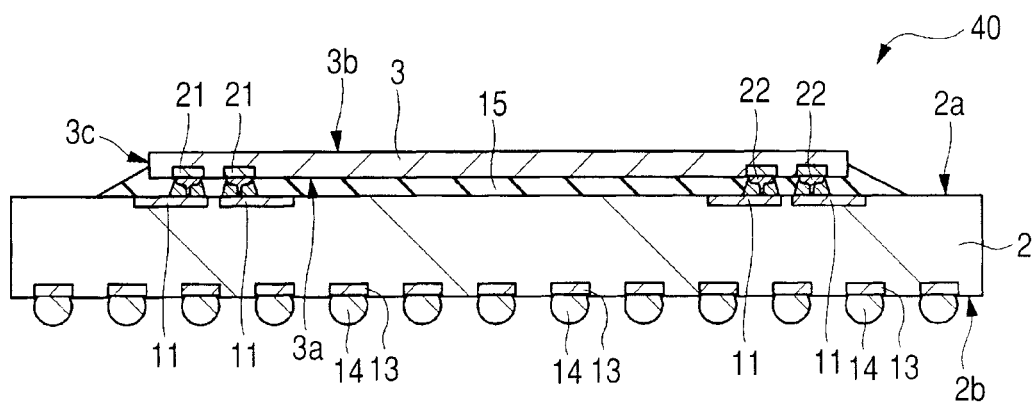
FIG. 22 is a sectional view showing a schematic structure of a semiconductor device as a modification of the semiconductor device referred to above in connection with FIGS. 1 to 21.

For example, although in the above embodiment a description was given about the SIP which the present inventors had studied concretely as a package type of a semiconductor device, the present invention is applicable widely to semiconductor devices wherein a semiconductor chip is flip-chip-mounted on a wiring substrate. For example, as shown in FIG. 22, the present invention is applicable to a semiconductor device 40 wherein a single microcomputer chip 3 is flip-chip-mounted on an upper surface of a wiring substrate 2. FIG. 22 is a sectional view showing a schematic structure of a semiconductor device as a modification of the semiconductor device described above in connection with FIGS. 1 to 21. The semiconductor device 40 shown in FIG. 22 is the same as the SIP 1 shown in FIG. 1 except that memory chips 4 (see FIG. 1) are not mounted on the back surface 3*b* of each microcomputer chip 3, that there are not used wires 5 (see FIG. 1) and terminals 12 (see FIG. 1) to be coupled to the memory chips, and that the sealing body 6 is not formed.

Also in the semiconductor device 40, though descriptions overlapping the descriptions on the SIP 1 will here be omitted, the microcomputer chip 3 is mounted so that its main surface 3*a* with plural pads 21 formed thereon confronts the upper surface 2*a* of the wiring substrate 2. Therefore, when coupling the pads 21 and the terminals 11 of the wiring substrate 2 electrically with each other, it is important from the standpoint of preventing the occurrence of a bonding defect to diminish temperature variations in each bonded portion. By applying the technique described in the above embodiment it is possible to prevent the occurrence of a bonding defect. Although in FIG. 22 the semiconductor chip which the semiconductor device 4 possesses is shown as the microcomputer chip 3 for the purpose of brief explanation, the type of the semiconductor chip is not limited to the microcomputer chip.

Although in the above embodiment reference was made to the configuration wherein the plural pads formed on the main surface of the flip-chip-mounted microcomputer chip were formed along each side of the main surface and in plural rows, the present invention is also applicable to such a semiconductor chip as plural pads being formed along each side of the main surface and in one row, if no consideration is given to making the semiconductor device concerned high in function and small in size. However, in case of forming plural pads in one row, the pads are present in only the pads layout direction (the direction along each side). Therefore, if the heat retaining effect is taken into account, it is preferable to form plural pads in plural rows as in the above embodiment.

Although SIP was described in the above embodiment, as another example of a semiconductor package mention may be made of a Package on Package (POP) type semiconductor device (POP) wherein a second semiconductor device (second semiconductor package) is stacked on a first semiconductor device (first semiconductor package) to configure a system.

For example, the POP is comprised of a first package with a controller chip mounted thereon and a second semiconductor package with a memory chip such as a DRAM or a flash memory mounted thereon, the second semiconductor package being stacked on the first semiconductor package. Further, the POP is mounted on for example a mother board (packaging substrate) of an external electronic device such as a mobile phone as a small-sized terminal device in communication system.

Since the POP is provided with plural wiring substrates, it is advantageous in that even upon increase in the number of input-output terminals of a controller chip with system multifunction, it is possible to increase the number of signal lines as compared with SIPs of the same packaging area. In the POP, moreover, since chips are coupled together after being mounted to each wiring substrate, it is possible to determine the state of coupling between the chips and the wiring substrate prior to the chip-to-chip coupling step. This is effective in improving the package assembling yield. This can also flexibly cope with small-lot multi-type production of system in comparison with SIP.

In the underlying first semiconductor package used in the POP of such a configuration, the controller type semiconductor chip is flip-chip-mounted from the standpoint of thinning the entire POP. In the first semiconductor package, therefore, the occurrence of a bonding defect can be prevented by applying the technique described in the above embodiment.

Figure 23:
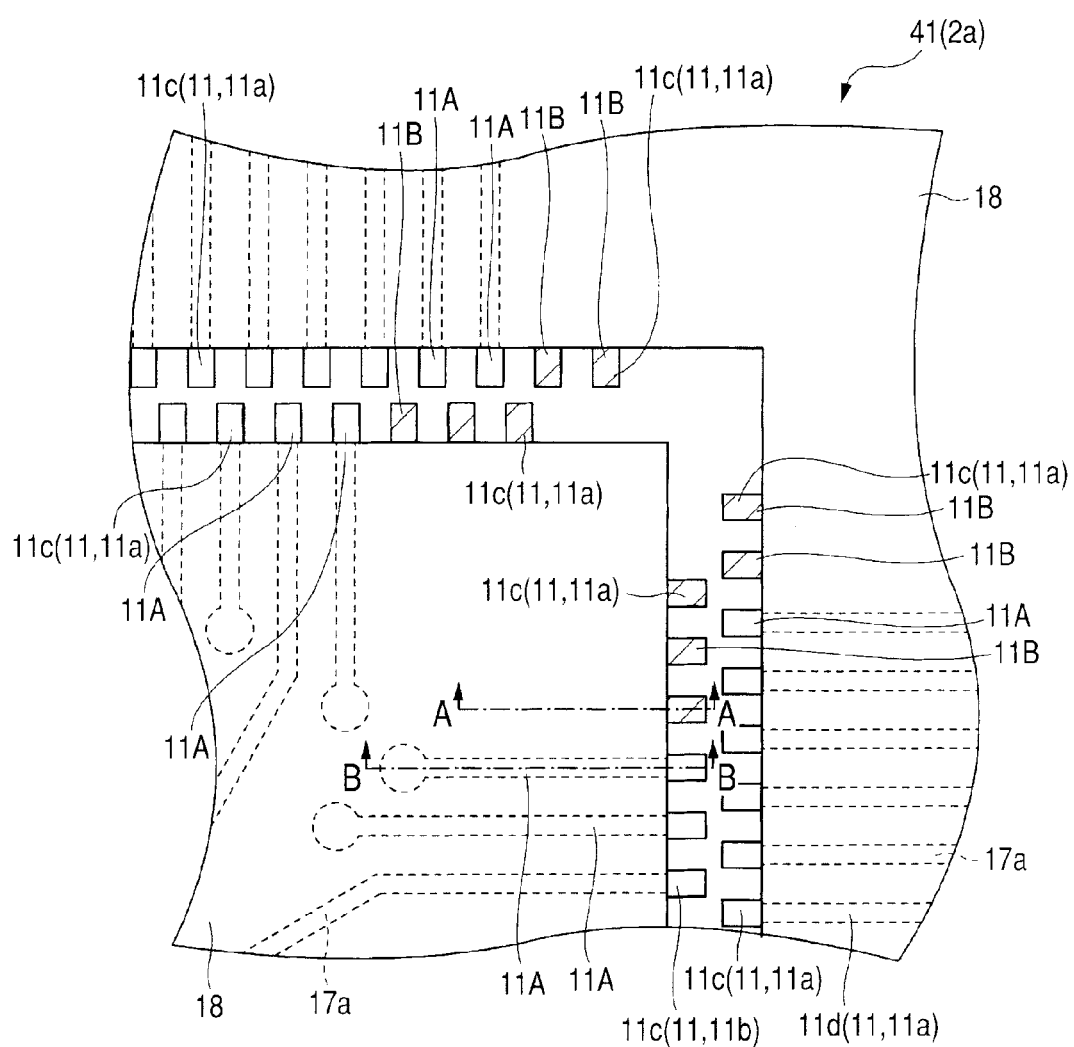
FIG. 23 is an enlarged plan view of a principal portion, showing a modification of the wiring substrate shown in FIG. 12.
Figure 24:
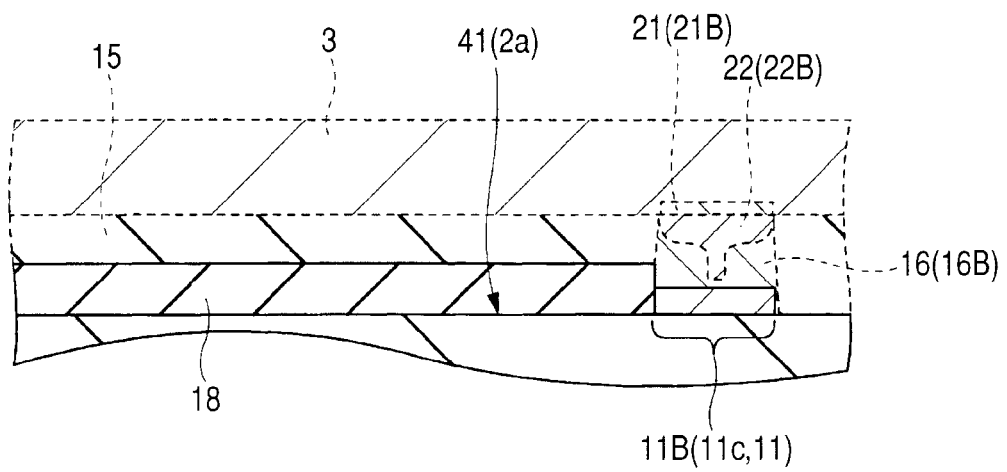
FIG. 24 is an enlarged sectional view of a principal portion taken along line A-A in FIG. 23.

In the above embodiment, as shown in FIG. 12, reference was made to the configuration wherein each terminal 11 is comprised of a bonding portion 11*c* and a lead-out line 11*d* coupled thereto, and both bonding portion 11*c* and lead-out line 11*d* are exposed from the insulating film 18. However, as shown in FIGS. 23 and 24, the present invention is applicable also to a semiconductor device having a wiring substrate 41 with only bonding portions 11*c* exposed from the insulating film 18. FIG. 23 is an enlarged plan view of a principal portion, showing a modification of the wiring substrate shown in FIG. 12, FIG. 24 is an enlarged sectional view of a principal portion taken along line A-A in FIG. 23, and FIG. 25 is an enlarged sectional view of a principal potion taken along line B-B in FIG. 23.

Figure 25:
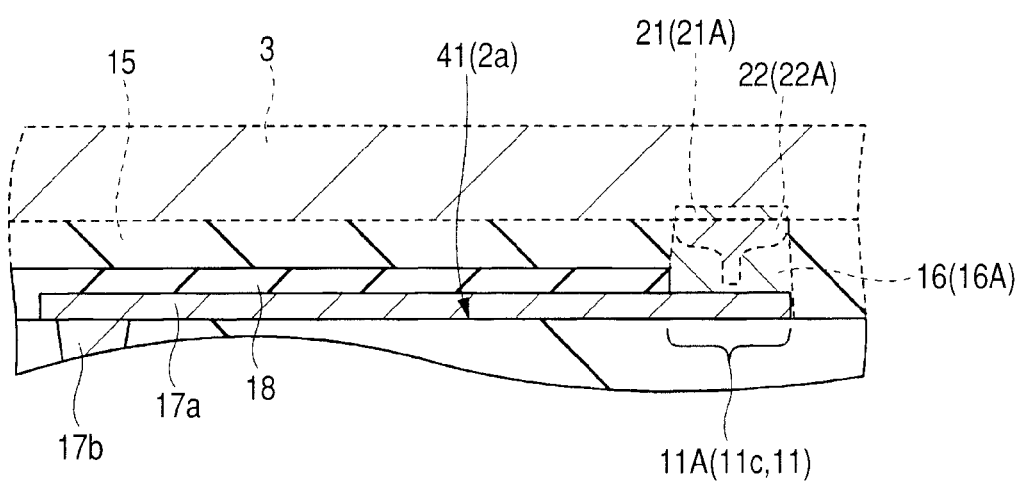
FIG. 25 is an enlarged sectional view of a principal portion taken along line B-B in FIG. 23.

In the case where lead-out lines exposed from the insulating film 18 are not formed like the wiring substrate 41 shown in FIGS. 23 to 25, all the terminals 11B can be exposed from the insulating film 18 if dummy terminals not electrically coupled to an external device are used as the terminals 11B. In this case, like the wiring substrate 2 shown in FIGS. 12 to 14, the layout of lead-out lines 11*d* need not be taken into account and hence the design freedom related to the layout of terminals 11 can be further improved.

Although in the above embodiment a description was given about the configuration wherein bumps formed on pads and terminals (bonding leads) corresponding to those bumps are coupled with each other through solder and are thereby allowed to function as integral heat retaining walls (heat sources). However, for function as heat retaining walls it suffices if the pads of a semiconductor chip and the bonding leads of a wiring substrate are thermally coupled with each other. Thus, the invention may be applied to such a configuration as pads and bonding leads being coupled together through solder. In bonding, however, since solder once melts with heat, so in order to effect a satisfactory pad-bonding lead coupling it is preferable to form a bump on a pad (salient electrode) and allow melted solder to wet and rise up to the bump as in the above embodiment.

Although in the above embodiment a description was given about countermeasurements to bonding defects occurring between bumps 22 and terminals 11 due to insufficient rise in temperature of the bumps 22 in case of electrically coupling the pads 21 of the semiconductor chip and the terminals 11 of the wiring substrate 2, it goes without saying that it is possible to cope with such bonding defects if wires are used instead of the bumps 22.

Figure 33:
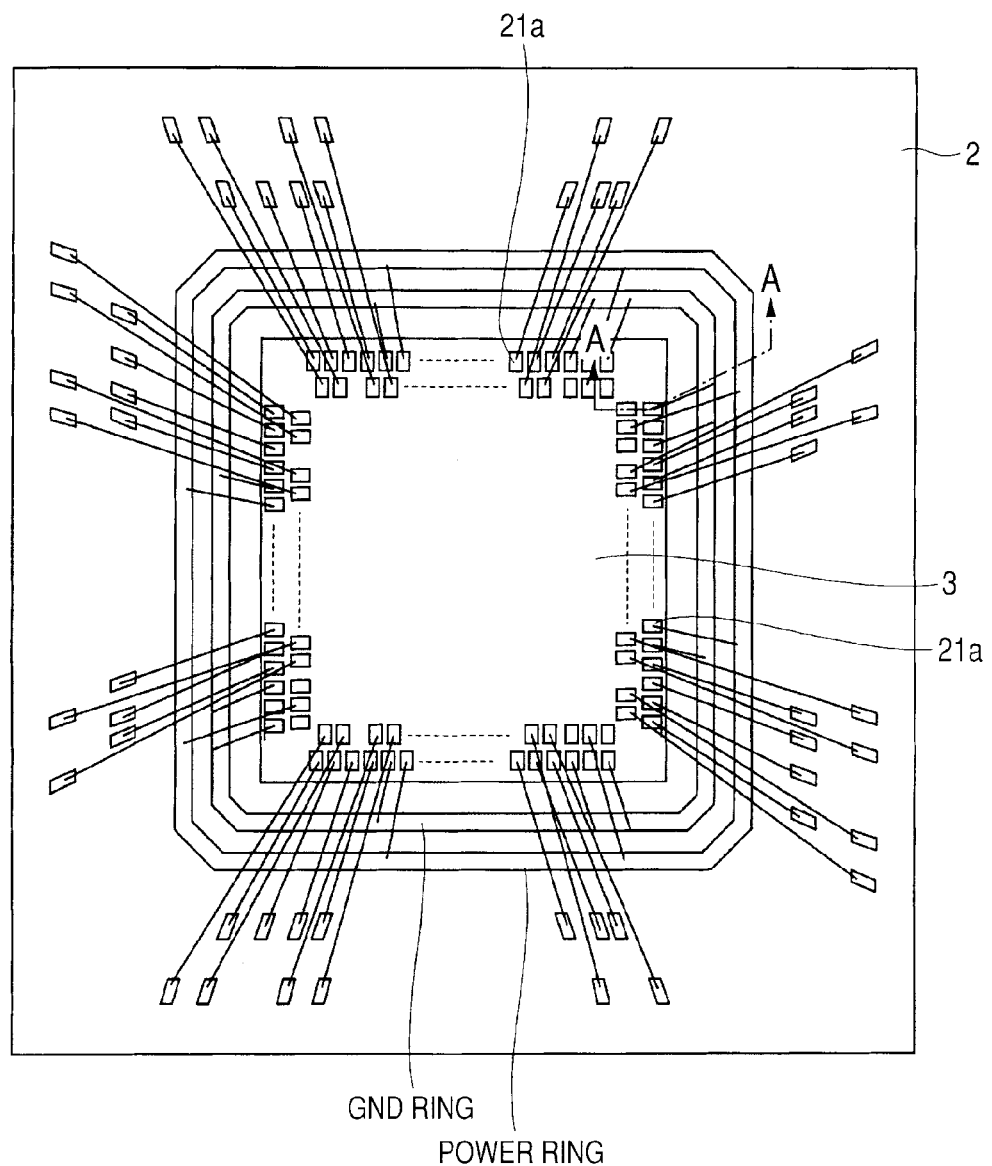
FIG. 33 is a plan view showing an entire structure of a semiconductor device according to another embodiment of the present invention.
Figure 34:
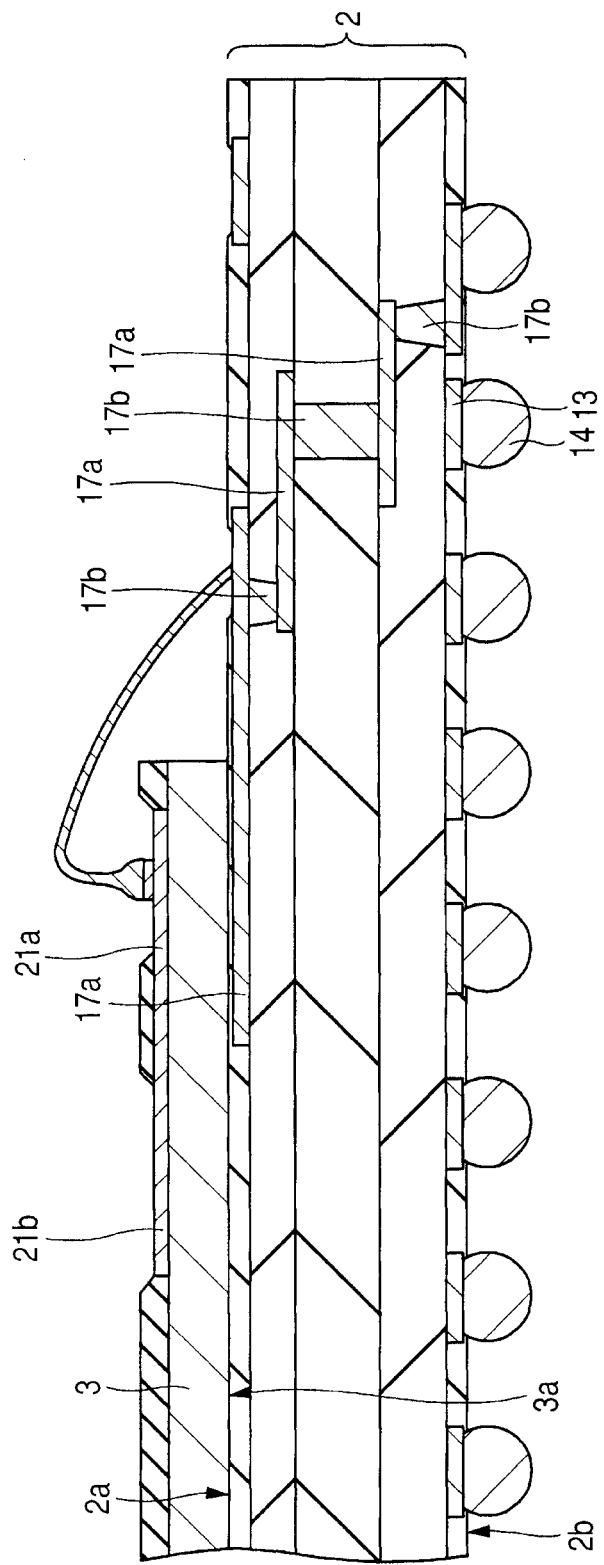
FIG. 34 is an enlarged sectional view of a principal portion taken along line A-A in FIG. 33.

In this case, according to the above embodiment, as shown in FIG. 10, a portion of wiring lines which configure the pads 21a disposed on the outer periphery side of the main surface of the semiconductor chip also configure the pads 21b disposed inside the pads 21a. Accordingly, for example, to avoid interference with wires coupled to other adjacent pads 21, it is possible to distribute wires to either the outer periphery-side pads 21a or the inner periphery-side pads 21b. Further, as shown in FIG. 33, around the semiconductor chip on the wiring substrate 2 there are formed power potential lines (or reference potential lines) continuously along each side of the semiconductor chip for strengthening the power supply potential (or reference potential). As shown in FIG. 34, by coupling those power supply lines electrically through wires with outer periphery-side pads (power supply pads) 21a out of plural pads 21 of the semiconductor chip, it is possible to shorten the wire length. As a result, it is possible to diminish an inductance component developed in each wire and hence possible to improve the reliability of the semiconductor device.

The present invention is applicable to a semiconductor device using the so-called flip-chip mounting technique in which a semiconductor chip with electrode pads formed thereon is mounted in such a state as its main surface being opposed to a chip mounting surface of a wiring substrate.

What is claimed is:

1. A semiconductor device comprising:
  a wiring substrate including an upper surface, a lower surface opposite the upper surface, a plurality of bonding leads formed over the upper surface, and a plurality of lands formed over the lower surface;
  a semiconductor chip including a main surface, a back surface opposite the main surface, and a plurality of pads formed over the main surface, the semiconductor chip being mounted over the wiring substrate such that the main surface of the semiconductor chip faces the upper surface of the wiring substrate, a plan view shape of the main surface of the semiconductor chip being quadrangular;
  a plurality of protruding electrodes respectively arranged between the pads of the semiconductor chip and the bonding leads of the wiring substrate; and
  a plurality of solder portions respectively arranged between the protruding electrodes and the bonding leads of the wiring substrate,
  wherein the plurality of pads is disposed at a peripheral portion of the main surface in the plan view, and is arranged along a side of the main surface of the semiconductor chip,
  wherein the plurality of pads includes a first pad and a second pad arranged next to the first pad in a first direction substantially parallel to the side of the semiconductor chip in the plan view,
  wherein the first and second pads are arranged such that the first pad is configured to pass a unique electric current therethrough, and the second pad is configured to not pass the unique electric current therethrough,
  wherein a first protruding electrode of the protruding electrodes is located between the first pad and a first bonding lead of the bonding leads,
  wherein a second protruding electrode of the protruding electrodes is located between the second pad and a second bonding lead of the bonding leads,
  wherein the plurality of pads is arranged in two rows including an outer row and an inner row,
  wherein the first pad is electrically connected to a circuit section formed in the semiconductor chip via a wiring,
  wherein a third pad of the plurality of pads is included in the inner row and is arranged next to the first pad in a second direction perpendicular to the first direction, and
  wherein the third pad is comprised of a part of the wiring.

* * * * *